United States Patent [19]
Darwish et al.

[11] Patent Number: 5,674,766
[45] Date of Patent: Oct. 7, 1997

[54] METHOD OF MAKING A TRENCH MOSFET WITH MULTI-RESISTIVITY DRAIN TO PROVIDE LOW ON-RESISTANCE BY VARYING DOPANT CONCENTRATION IN EPITAXIAL LAYER

[75] Inventors: Mohamed N. Darwish, Saratoga; Richard K. Williams, Cupertino, both of Calif.

[73] Assignee: Siliconix incorporated, Santa Clara, Calif.

[21] Appl. No.: 429,414

[22] Filed: Apr. 26, 1995

Related U.S. Application Data

[62] Division of Ser. No. 367,516, Dec. 30, 1994, abandoned.
[51] Int. Cl.$^6$ .................................................. H01L 21/265
[52] U.S. Cl. ..................... 437/40; 437/81; 437/108; 437/110; 437/112; 437/DIG. 971; 257/332
[58] Field of Search ..................... 437/40 RG, 40 DM, 437/41 DM, 81, 108, 110, 112, DIG. 971, DIG. 973; 257/329, 330, 331, 332, 341, 408

[56] References Cited

U.S. PATENT DOCUMENTS

| | | | |
|---|---|---|---|
| 3,956,037 | 5/1976 | Ishii et al. | 437/112 |
| 4,528,745 | 7/1985 | Muraoka et al. | 437/108 |
| 4,838,993 | 6/1989 | Aoki et al. | 437/112 |
| 4,885,260 | 12/1989 | Ban et al. | 437/112 |
| 4,893,160 | 1/1990 | Blanchard | 257/331 |
| 4,894,349 | 1/1990 | Saito et al. | 437/112 |
| 4,941,026 | 7/1990 | Temple | 357/23.4 |
| 5,034,785 | 7/1991 | Blanchard | 257/330 |
| 5,162,256 | 11/1992 | Jürgensen | 437/108 |
| 5,168,331 | 12/1992 | Yilmaz | 257/331 |
| 5,341,011 | 8/1994 | Hshieh et al. | 257/330 |
| 5,432,121 | 7/1995 | Chan et al. | 437/110 |
| 5,545,586 | 8/1996 | Koh | 437/40 DM |

FOREIGN PATENT DOCUMENTS

| | | |
|---|---|---|
| 0 308 612 | 3/1989 | European Pat. Off. . |
| 0 583 022 | 2/1994 | European Pat. Off. . |
| 0 583 028 | 2/1994 | European Pat. Off. . |
| 62-115873 | 5/1987 | Japan . |
| 92 14269 | 8/1992 | WIPO . |

OTHER PUBLICATIONS

Shenai, K.: "Optimized Trench MOSFET Technologies for Power Devices", IEEE Transactions on Electron Devices, Jun. 1992, USA, vol. 39, NR. 6, pp. 1435–1443, ISSN 0018-9383 XP000271790.

*Primary Examiner*—Charles L. Bowers, Jr.
*Assistant Examiner*—Lynne A. Gurley
*Attorney, Agent, or Firm*—Skjerven, Morrill, MacPherson, Franklin & Friel; David E. Steuber

[57] ABSTRACT

A MOSFET switch with a gate formed in a trench has a drain which includes a region of relatively high resistivity adjacent the trench and a region of relatively low resistivity further away from the trench. The drain may also include a "delta" layer having even lower resistivity in a central region of the MOSFET cell. The high resistivity region limits the strength of the electric field at the edge of the trench (particularly where there are any sharp corners) and thereby avoids damage to the gate oxide layer. The central "delta" layer helps to insure that any breakdown will occur near the center of the MOSFET cell, away from the gate oxide, and to lower the resistance of the MOSFET when it is in an on condition.

21 Claims, 23 Drawing Sheets

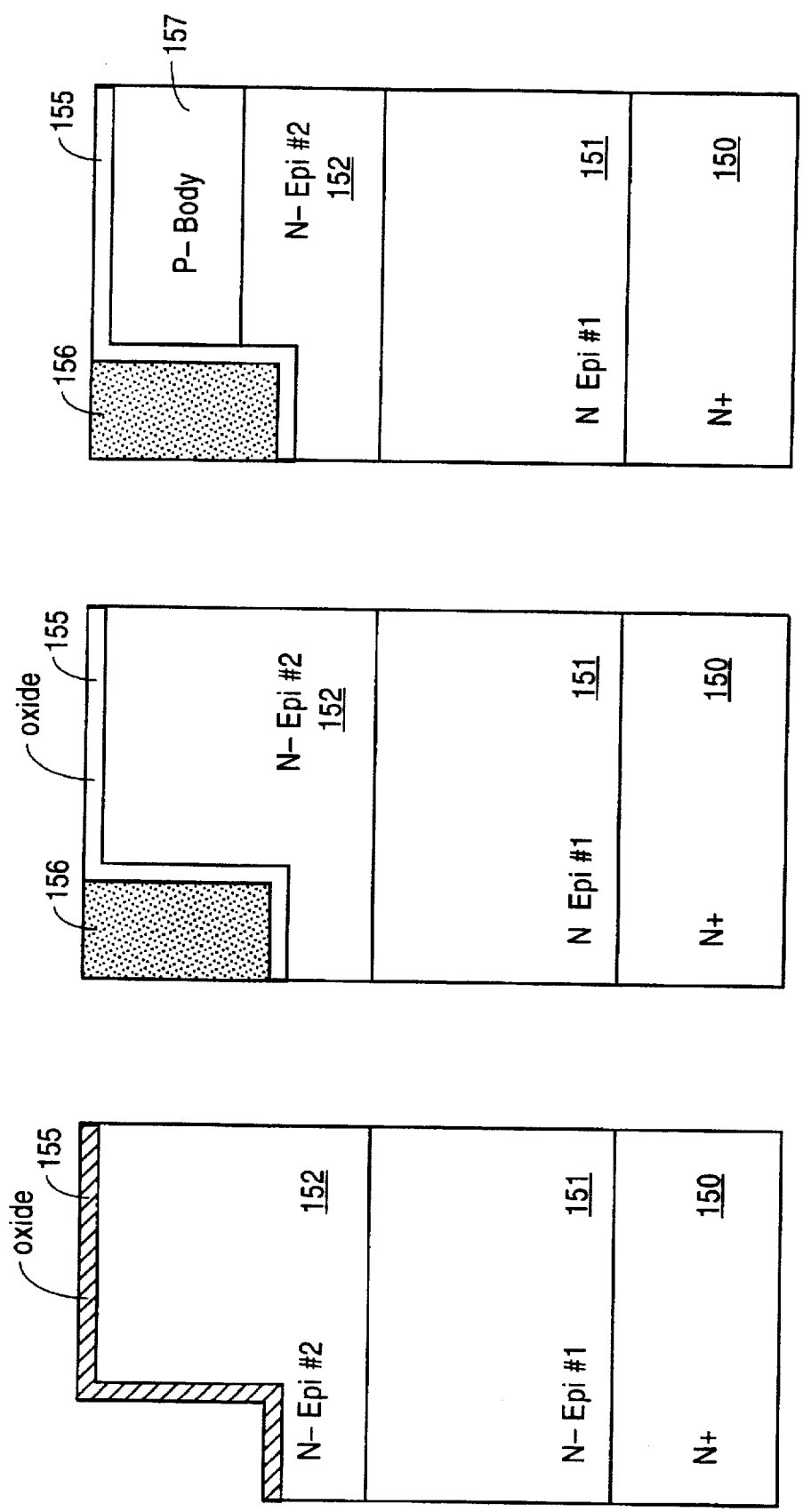

METHOD OF MAKING A TRENCH MOSFET WITH MULTI-RESISTIVITY DRAIN TO PROVIDE LOW ON-RESISTANCE BY VARYING DOPANT CONCENTRATION IN EPITAXIAL LAYER

This application is a division of application Ser. No. 08/367,516, filed Dec. 30, 1994 now abandoned.

CROSS-REFERENCE TO RELATED APPLICATION

This application is related to application Ser. No. 08/367,027, filed Dec. 30, 1994, which is incorporated herein by reference in its entirety.

FIELD OF THE INVENTION

This invention relates to current switching MOSFETs having a gate formed in a trench and in particular to a trench MOSFET (metal-oxide-silicon field-effect transistor) having a lower resistance when the device is turned on.

BACKGROUND OF THE INVENTION

Power MOSFETs are widely used in numerous applications, including automotive electronics, disk drives and power supplies. Generally, these devices function as switches, and they are used to connect a power supply to a load. It is important that the resistance of the device be as low as possible when the switch is closed. Otherwise, power is wasted and excessive heat may be generated.

A common type of power MOSFET currently in use is a planar, double-diffused (DMOS) device, illustrated in the cross-sectional view of FIG. 1. An electron current flows laterally from source regions 12 through channel regions formed within P-body regions 14 into an N-epitaxial layer 16. Current flow in the channel regions is controlled by a gate 18. After the current leaves the channel regions, it flows downward through N-epitaxial layer 16 into an substrate 20, which forms the drain of the device. A parasitic junction field effect transistor (JFET) is formed by the existence of P-body regions 14 on either side of an intervening region of N-epitaxial layer 16. A depletion zone 22 adjacent the junction between each of P-body regions 14 and N-epitaxial layer 16 tends to squeeze the current and thereby increase the resistance in this area. As the current proceeds downward through N-epitaxial layer 16 it spreads out and the resistance decreases.

In an alternative form of vertical current flow device, the gate is formed in a "trench". Such a device is illustrated in FIG. 2A, which is a cross-sectional view of a single cell of a MOSFET 100, and in FIG. 2B, which is a plan view of the cell. Gates 102 and 104 are formed in trenches and surrounded by gate oxide layers 106 and 108, respectively. The trench gate is often formed in a grid pattern including an array of polygonal shapes (one section of which is shown in FIG. 2B), the grid representing a single interconnected gate (gates 102 and 104 being the same), but a trench gate may also be formed as a series of distinct parallel stripes.

MOSFET 100 is a double-diffused device which is formed in an N-epitaxial layer 110. An source region 112 is formed at the surface of epitaxial layer 110, as is a P+ contact region 114. A P-body region 116 is located below source region 112 and P+ contact region 114. A metal source contact 118 makes contact with the source region 112 and shorts the source region 112 to the P+ contact region 114 and P body region 116.

The N-epitaxial layer 110 is formed on an substrate 120, and a drain contact (not shown) is located at the bottom of the substrate 120. The contact for the gates 102 and 104 is likewise not shown, but it is generally made by extending the conductive gate material outside of the trench and forming a metal contact at a location remote from the individual cells. The gate is typically made of phosphorus or boron doped polysilicon.

A region 111 of N-epitaxial layer 110 between the substrate 120 and the P body 116 is generally more lightly doped with N-type impurities than substrate 120. This increases the ability of MOSFET 100 to withstand high voltages. Region 111 is sometimes referred to as a "lightly doped" or "drift" region ("drift" referring to the movement of carriers in an electric field). Drift region 111 and substrate 120 constitute the drain of MOSFET 100.

MOSFET 100 is an N-channel MOSFET. When a positive voltage is applied to gate 102, a channel region within P-body region 116 adjacent the gate oxide 106 becomes inverted and, provided there is a voltage difference between the source region 112 and the substrate 120, an electron current will flow from the source region through the channel region into drift region 111. In drift region 111, some of the electron current spreads diagonally at an angle until it hits the substrate 120, and then it flows vertically to the drain. Other portions of the current flow straight down through drift region 111, and some of the current flows underneath the gate 102 and then downward through drift region 111.

The gate 102 is doped with a conductive material. Since MOSFET 100 is an N-channel MOSFET, gate 102 could be polysilicon doped with phosphorus. Gate 102 is insulated from the remainder of MOSFET 100 by the gate oxide 106. The thickness of gate oxide 106 is chosen to set the threshold voltage of MOSFET 100 and may also influence the breakdown voltage of MOSFET 100. The breakdown voltage of a power MOSFET such as MOSFET 100 would typically be no greater than 200 volts and more likely 60 volts or less.

One feature that makes the trench configuration attractive is that, as described above, the current flows vertically through the channel of the MOSFET. This permits a higher packing density than MOSFETs such as the planar DMOS device shown in FIG. 1 in which the current flows horizontally through the channel and then vertically through the drain. Greater cell density generally means more MOSFETs per unit area of the substrate and, since the MOSFETs are connected in parallel, the on-resistance of the device is reduced.

In MOSFET 100 shown in FIG. 2A, the P+ contact region 114 is quite shallow and does not extend to the lower junction of the P-body region 116. This helps ensure that P-type dopant does not get into the channel region, where it would tend to increase the threshold voltage of the device and cause the turn-on characteristics of the device to vary from one run to another depending on the alignment of the P+ contact region 114. However, with a shallow P+ region 114, the device can withstand only relatively low voltages (e.g., 10 volts) when it is turned off. This is because the depletion spreading around the junction between P-body region 116 and drift region 111 does not adequately protect the corners of the trench (e.g., corner 122 shown in FIG. 1A). As a result, avalanche breakdown may occur in the vicinity of the trench, leading to a high generation rate of carriers which can charge or degrade the gate oxide 106 or even, in an extreme case, cause a rupture in the gate oxide 106. Thus the MOSFET 100 shown in FIG. 1B is at best a low voltage device.

FIG. 2C illustrates MOSFET 200, a modification of MOSFET 100 in which the P+ body contact region 114 is extended downward slightly beyond the lower junction of P-body region 116. The higher concentration of P ions in this region increases the size of the depletion area, and this provides some additional shielding around the corner 122 of the trench. However, if this device is pushed into breakdown, the generation of carriers will still most likely occur near gate oxide layer 106, and this could lead to the impairment of the gate oxide as described above.

The breakdown situation was significantly improved in the arrangement shown in FIGS. 3A–3C, which was described in U.S. Pat. No. 5,072,266 to Bulucea et al. In MOSFET 300, the P+ region 114 is extended downward below the bottom of the trench to form a deep, heavily-doped P region at the center of the cell. While this provides additional shielding at corner 122, the primary advantage is that carrier generation occurs primarily at the bottom tip 302 of the P+ region 114. This occurs because the electric field is strengthened beneath the tip 302, thereby causing carriers to be generated at that point or along the curvature of the junction rather than adjacent the gate oxide 106. This reduces the stress on gate oxide 106 and improves the reliability of MOSFET 300 under high voltage conditions, even though it may reduce the actual junction breakdown of the device.

FIG. 3B illustrates a perspective cross-sectional view of the left half of the cell shown in FIG. 3A, as well as portions of the adjoining cells. FIG. 3C shows a comparable P-channel device. FIG. 3D illustrates how a gate metal 121 may be used to form a connection with gates 102 and 104.

The deep central P+ region 114 in MOSFET 300, while greatly reducing the adverse consequences of breakdown, also has some unfavorable effects. First, an upward limit on cell density is created, because with increasing cell density boron ions may be introduced into the channel region. As described above, this tends to increase the threshold voltage of the MOSFET. Second, the presence of a deep P+ region 114 tends to pinch the electron current as it leaves the channel and enters the drift region 111. In an embodiment which does not include a deep P+ region (as shown in, for example, FIG. 2A), the electron current spreads out when it reaches drift region 111. This current spreading reduces the average current per unit area in the N epitaxial layer 110 and therefore reduces the on-resistance of the MOSFET. The presence of a deep central P+ region limits this current spreading and increases the on-resistance.

What is needed, therefore, is a MOSFET which combines the breakdown advantages of a deep central P+ region with a low on-resistance and a good current distribution in the epitaxial layer.

SUMMARY OF THE INVENTION

The trench MOSFET of this invention includes a gate formed in a trench, a source region of a first conductivity type, a body region of a second conductivity type located under the source region, a drain region of first conductivity type located under the body region, and a "lightly doped" or "drift" region within the drain region, the dopant concentration of the drift region being lower than the dopant concentration of the drain region generally. The drain may include a substrate or, in "quasi-vertical" embodiments, the drain may include a buried layer of first conductivity which is connected to the top surface of the semiconductor material via, for example, a "sinker" region. The drift region may be formed in an epitaxial layer or a substrate.

When the MOSFET is turned on, an electron current flows vertically through a channel within the body region adjacent the trench.

In accordance with the invention, the drift region includes regions of differing resistivity. A region of relatively high resistivity is formed in the drift region generally below and adjacent to the trench. The region of high resistivity is doped with ions of the first conductivity type at a concentration which is lower than the concentration of ions of the first conductivity type in other parts of the drift region. There are numerous variants of this arrangement. For example, the region of high resistivity may have a substantially uniform dopant concentration (and resistivity); or the dopant concentration may vary (e.g., linearly or according to some other function) in the region of high resistivity. The region of high resistivity should encompass the point on the trench boundary (e.g., a corner) where the electric field reaches a maximum when the MOSFET is subjected to a source-to-drain voltage while the MOSFET is in an off condition.

In a preferred embodiment, the drift region also includes a "delta" layer, which has a lower resistivity than the region of high resistivity, since the delta layer is doped with ions of the first conductivity type at a concentration higher than the concentration of such ions in the region of high resistivity. The delta layer is typically formed at a central location of the MOSFET cell, away from the trench, although in some embodiments the delta region may extend to or under the trench. The delta layer has a resistivity that is higher than the resistivity of regions of the drain surrounding the delta layer.

The region of high resistivity adjacent the trench limits the strength of the electric field along the boundary of the trench, particularly at sharp corners, and thereby helps to prevent voltage breakdown near gate oxide layer. The "delta" layer helps insure that any voltage breakdown will occur near the center of the MOSFET cell rather than at the surface of the gate oxide. Moreover, the delta layer improves the distribution of the current and reduces the on-resistance of the MOSFET.

This technique reduces the electric field at the trench without limiting increases in cell density in the manner of the deep central region of second conductivity described above. Moreover, the electron current is not crowded in the region of the trench, and hence the on-resistance of the MOSFET is improved as compared with embodiments having a deep central diffusion.

Alternatively, particularly where cell density is not a paramount concern, a region of second conductivity type may be formed at the center of the MOSFET cell to help control the electric field strength at the edge of the trench. The central region of second conductivity type may be used alone or in conjunction with a delta layer.

As used herein, terms which define physical direction or relationships, such as "below", "higher" or "lateral", are intended to refer to a MOSFET oriented as shown in FIGS. 3A–3C and 4, with the trench at the top surface of the device. It is understood that the MOSFET itself may be oriented in any manner.

BRIEF DESCRIPTION OF THE DRAWINGS

FIGS. 6A–6J illustrate steps in a process of fabricating a MOSFET in accordance with the invention.

In the various figures of the drawing, like reference numerals are used to designate similar elements.

DESCRIPTION OF THE INVENTION

Figure 4:
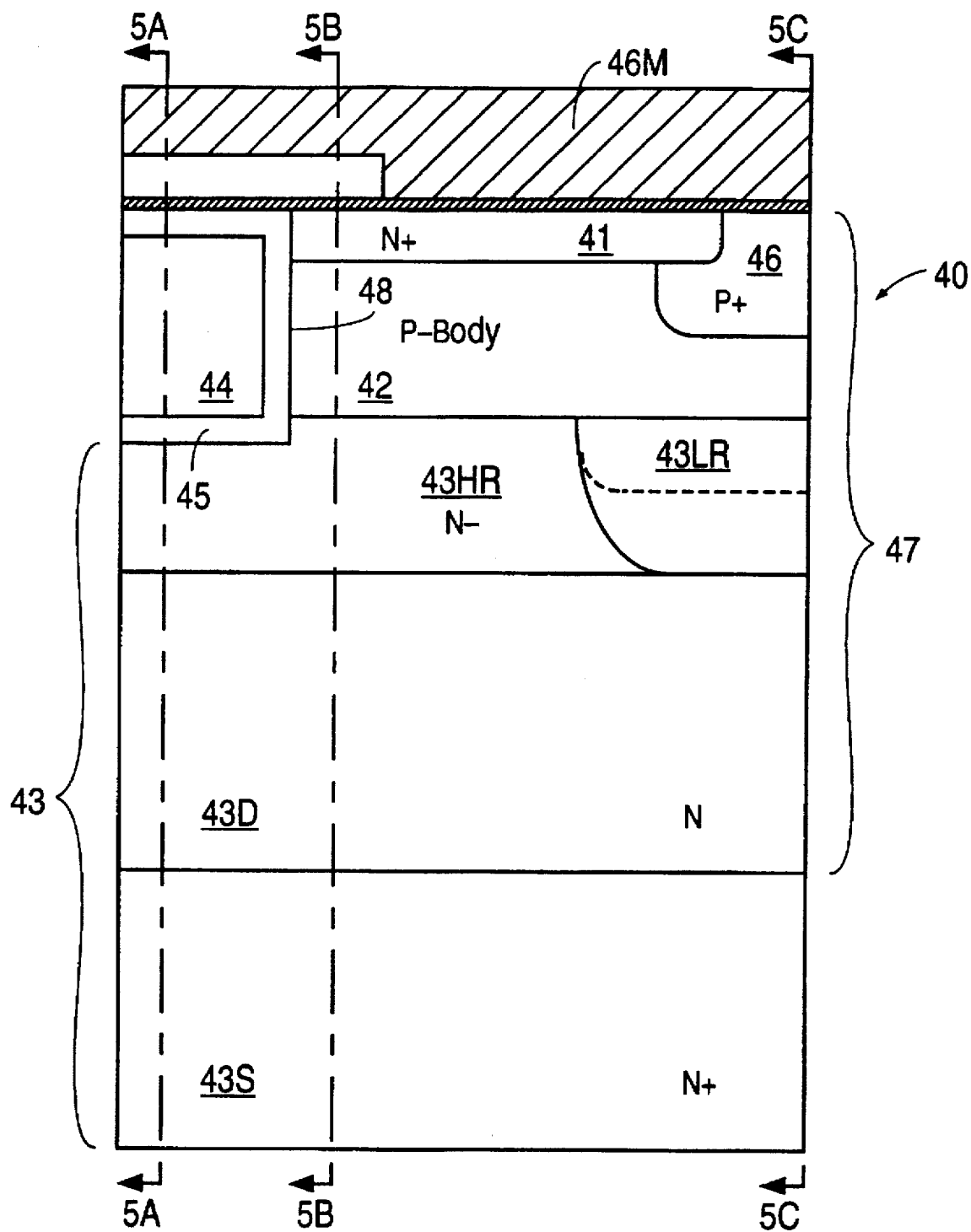
FIG. 4 illustrates a cross-sectional view of a MOSFET in accordance with this invention.

A cross-sectional view of a MOSFET 40 in accordance with the invention is illustrated in FIG. 4. MOSFET 40 includes a source region 41, a P-body region 42 and an N drain region 43. A gate 44 is formed in a trench 48 and is insulated from the active regions of the device by an oxide layer 45. A P+ contact region 46 is formed adjacent source region 41, and regions 41 and 46 are shorted together by a metal contact 47.

N drain region 43 includes four different regions in this embodiment: a substrate 43S; a "drift" region 43D; a region of high resistivity 43HR adjacent a portion of trench 48; and a central "delta" layer 43LR, which has a low resistivity compared to region 43HR.

As used herein, the term "delta layer" means a layer beneath the body region in a trenched vertical MOSFET in which the dopant concentration is greater than the dopant concentration in a region immediately below the delta layer. The boundaries of the delta layer are located where the dopant concentration ceases to decrease (i.e., either remains the same or increases) or where the delta layer abuts the body region. (Some of the dopant used to form the delta layer may extend into the body region, although in this event the dopant used to form the body region will compensate for and counterdope the delta layer dopant in the area of the overlap.) The lower boundary of the delta layer may be located at a level which is either above or below the bottom of the trench, and which is either above or below the bottom of a region of opposite conductivity at the center of the cell. The upper boundary of the delta layer may coincide with the lower junction of the body region, or the upper boundary of the delta layer may be below the lower junction of the body region.

Drift region 43D and all of the overlying semiconductor layers are formed in an epitaxial layer 47, which is formed on the top surface of substrate 43S. The trench 48 is also formed in epitaxial layer 47.

In other embodiments, the drift region may be formed in a substrate. Moreover, while trench 48 is rectangular in cross section, the trench may alternatively be U- or V-shaped or some other shape.

FIG. 4 illustrates a cross-sectional view of a half-cell of MOSFET 40. Thus, the left hand edge of the drawing is located approximately at the center of gate 44, and the cross-section designated 5C—5C is at the center of the cell. Gate 44 could be formed in a rectilinear, hexagonal or other type of grid pattern (see FIGS. 3B and 3C), in which case a "cell" would include an area bounded on all sides by a portion of gate 44. Alternatively, gate 44 could be in a series of parallel gate "stripes".

Figure 5A:
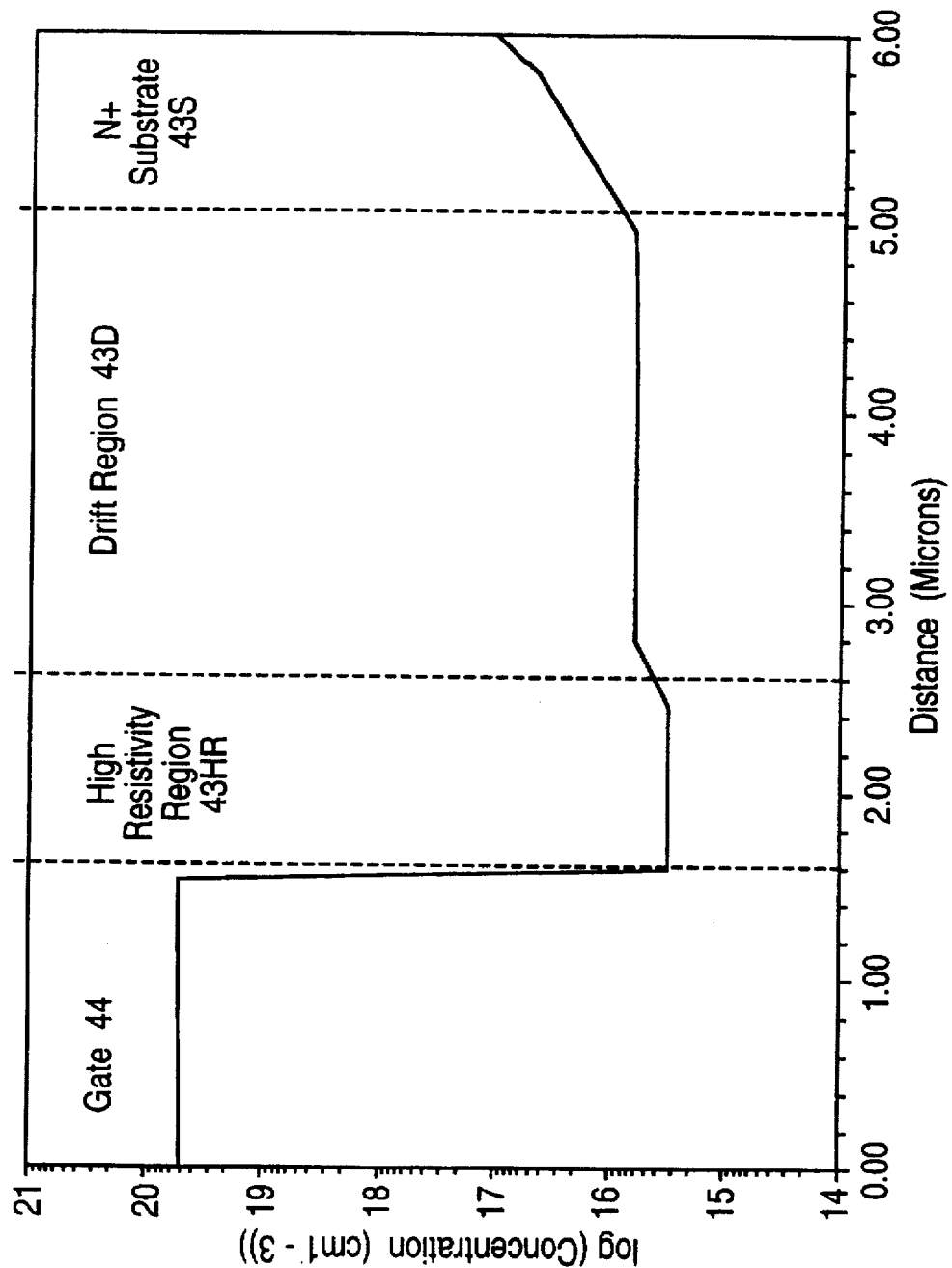
FIG. 5A illustrates a graph showing the concentration of dopant through a cross-section taken through the gate of the MOSFET shown in FIG. 4.
Figure 5B:
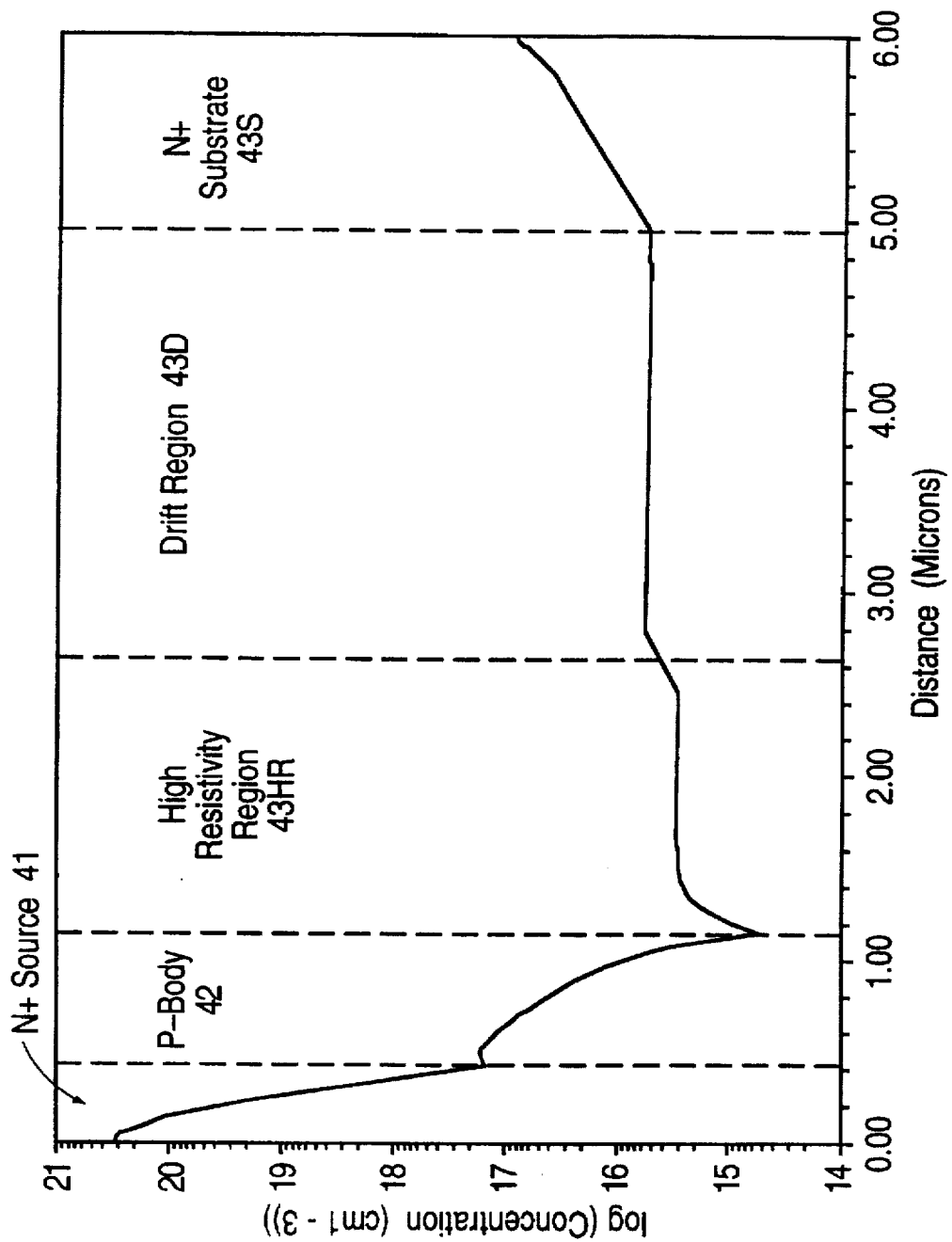
FIG. 5B illustrates a graph showing the concentration of dopant at a cross-section taken near the channel of the MOSFET shown in FIG. 4.
Figure 5C:
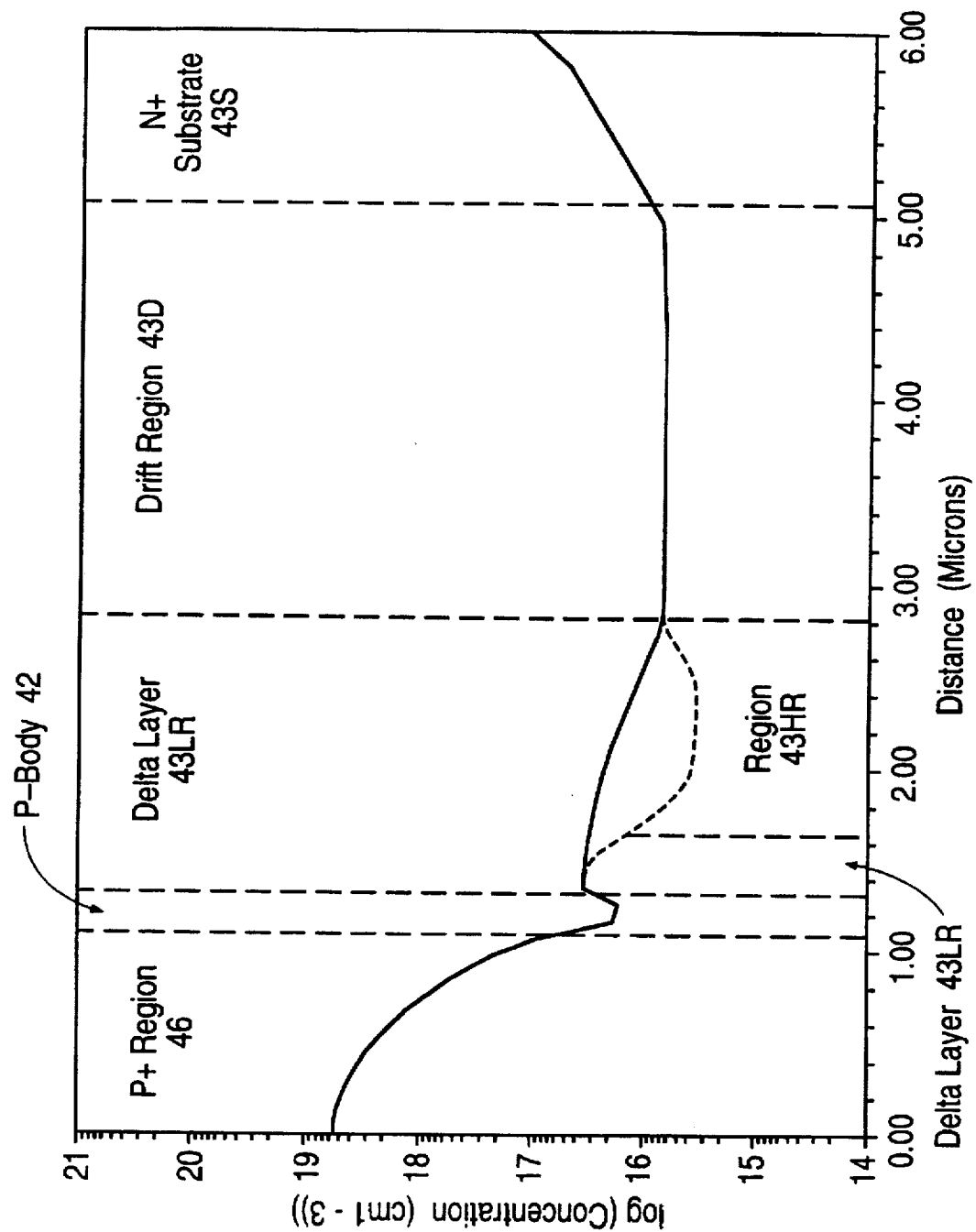
FIG. 5C illustrates a graph showing the concentration of dopant at a cross-section taken at the center of the cell of the MOSFET shown in FIG. 4.

The structure of MOSFET 40 will be better understood by reference to FIGS. 5A, 5B and 5C, which show the concentration of N- or P-type dopant at three vertical cross-sections.

FIG. 5A shows the dopant concentration at the cross-section designated 5A—5A in FIG. 4, which extends through a central portion of gate 44. The horizontal axis of FIG. 5A is the distance (in µm) below the top surface of epitaxial layer 47, and the vertical axis is the $\log_{10}$ of the dopant concentration (in cm$^{-3}$). The substrate 43S is doped with N-type dopant to a resistivity of approximately 3.0 mΩ-cm. The concentration of N-type dopant falls to a concentration in the range $5 \times 10^{14}$ to $5 \times 10^{16}$ cm$^{-3}$ (e.g., $6 \times 10^{15}$ cm$^{-3}$) in drift region 43D and to a concentration in the range $3 \times 10^{14}$ to $3 \times 10^{16}$ cm$^{-3}$ (e.g., $3 \times 10^{15}$ cm$^{-3}$) in region of high resistivity 43HR. The dopant concentration of $6 \times 10^{15}$ cm$^{-3}$ and $3 \times 10^{15}$ cm$^{-3}$ in drift region 43D and region of high resistivity 43HR yield resistivities of 0.8 Ω-cm and 1.5 Ω-cm, respectively, for an N-channel device. The dopant concentration of region of high resistivity 43HR should be lower than the dopant concentration of delta layer 43LR.

Gate 44 is doped with phosphorus ions at a concentration of $5 \times 10^{19}$ cm$^{-3}$ (typically 20 Ω/sq.). (In a P-channel device, the gate may be doped with boron.) The bottom of the trench 48 is approximately 1.6 µm (alternatively in the range 1–3 µm) below the top surface, and the boundary between region 43HR and drift region 43D is approximately 2.6 µm (alternatively in the range 2–5 µm) below the surface. Epitaxial layer 47 is approximately 5.0 µm thick.

FIG. 5B shows the dopant concentrations of MOSFET 40 at cross-section 5B—5B shown in FIG. 4. The dopant levels in substrate 43S and drift region 43D are the same as those shown in FIG. 5A. Similarly, the concentration of N-type dopant in region 43HR remains at $3\times10^{15}$ cm$^{-3}$, but region 43HR extends upward to within 1.2 µm of the top surface, or above the bottom of the trench. The concentration of dopant in P-body 42 increases from $6\times10^{14}$ cm$^{-3}$ at the junction with region 43HR to approximately $1\times10^{17}$ cm$^{-3}$ at the junction with source region 41. The concentration of N-type dopant in source region 41 increases from approximately $1\times10^{17}$ cm$^{-3}$ at that level to $2\times10^{20}$ cm$^{-3}$ at the top surface of the structure. It is apparent from FIGS. 5A and 5B that region of high resistivity 43HR extends around the bottom and side of trench 48 and includes the corner of trench 48 where the electric field normally reaches a maximum.

FIG. 5C shows the dopant concentrations in MOSFET 40 at the cross-section designated 5C—5C in FIG. 4, which represents the center of the cell. Again, the dopant concentrations in substrate 43S and drift region 43D remain the same. P+ contact region 46 has a dopant concentration which reaches a maximum of approximately $5\times10^{18}$ cm$^{-3}$ at the top surface of the device. Immediately below P+ region 46 is a portion of P-body region 42 which has a dopant concentration in the neighborhood of $2\times10^{16}$ cm$^{-3}$. Immediately below the P-body region 42 in the center of the cell is the delta layer 43LR, which may extend to the ordinary portions of drift region 43D, as indicated by the solid line in FIG. 4. Alternatively, a portion of region 43HR may separate delta layer 43LR from the ordinary portions of drift region 43D at the center of the cell. This is indicated by the dashed line in FIG. 4, and the dopant concentrations for this alternative embodiment are illustrated by the dashed line in FIG. 5C.

Delta layer 43LR helps to ensure that the device breaks down in the region of the center of the cell rather than at a location adjacent to the trench, where breakdown may damage or destroy the gate oxide 45. Moreover, delta layer 43LR represents an area of low resistivity and therefore compensates to some extent for the higher resistivity of the region 43HR. Thus, the combination of region 43HR and delta layer 43LR provides an area of relatively high resistivity surrounding the trench and an area of relatively low resistivity at the center of the cell.

FIGS. 6A–6J illustrate a process for fabricating a MOSFET in accordance with this invention.

Figure 6C:
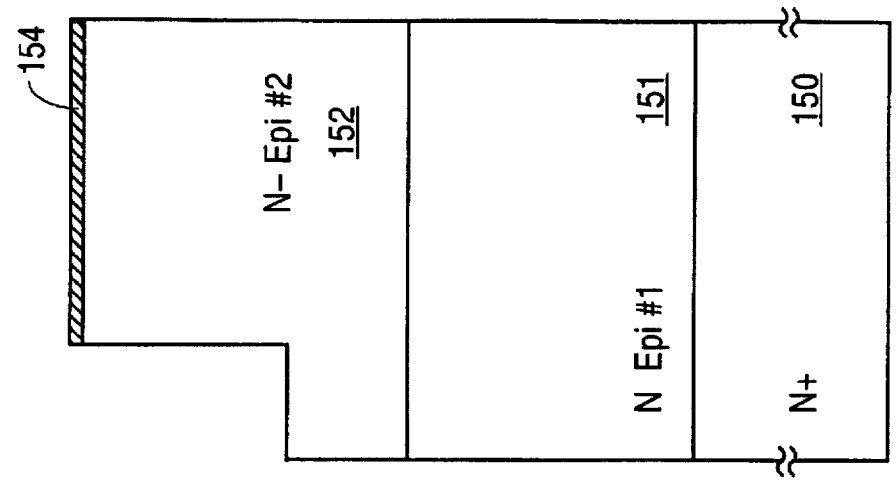
Figure 6B:
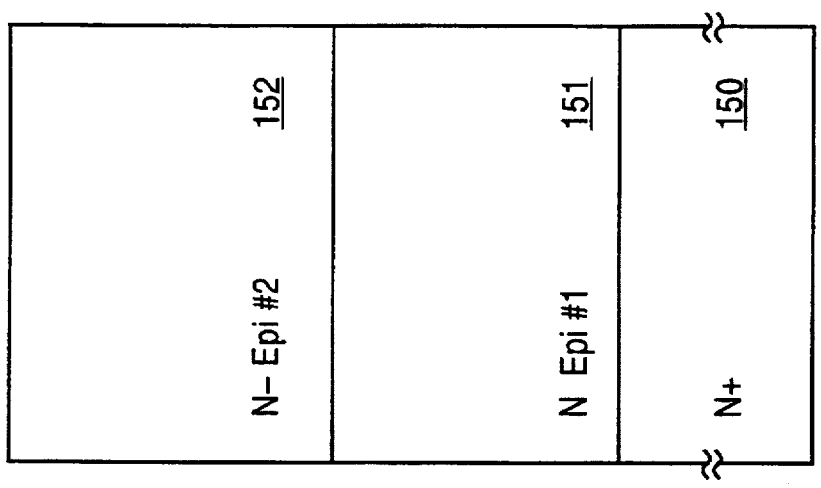
Figure 6A:
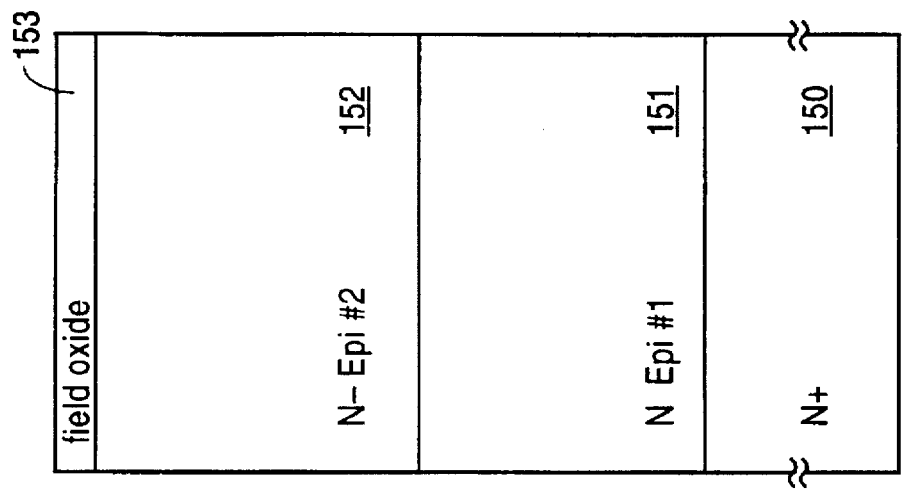

As shown in FIG. 6A, the process begins with an substrate 150, which may be 500 µm thick and have a resistivity of 3 mΩ-cm. A first N-epitaxial layer 151 and then a second N-epitaxial layer 152 are grown on the top surface of substrate 150 in succession. First N-epitaxial layer 151 is doped to a concentration of, for example, $6\times10^{15}$ cm$^{-3}$, and second N-epitaxial layer 152 is doped to a concentration of, for example, $3\times10^{15}$ cm$^{-3}$. Preferably, substrate 150 is not removed from the epi reactor in the course of growing epitaxial layers 151 and 152.

Alternatively, instead of growing two epitaxial layers having different uniform concentrations of dopant, respectively, the concentration of N-type dopant can be reduced gradually and monotonically while at least a portion of the epitaxial layer is being grown, so as to form a region of high resistivity. For example, the concentration of dopant could be reduced gradually from the concentration in the substrate to a concentration of about $3\times10^{15}$ cm$^{-3}$ near the surface (e.g., at a depth of 3 µm). The reduction can be performed according to a linear or some other function.

A field oxide layer 153 is then grown on the top surface of N-epitaxial layer 152 by heating the structure in an oxidizing ambient such as oxygen or steam at 900°–1100° C.

As shown in FIG. 6B, field oxide layer 153 is patterned and etched from the active areas of the device. Field oxide layer 153 remains in the high-voltage termination at the outer edge of the die, and in regions to be used for busing the polysilicon gate.

As shown in FIG. 6C, an oxide layer 154 400 Å thick is grown to prevent contamination, and the trench area is then patterned with photoresist. The trench is then etched to an appropriate depth, leaving a desired thickness of second N-epitaxial layer 152 below the bottom of the trench.

As shown in FIG. 6D, oxide layer 154 and the photoresist are then removed. A gate oxide layer 155 is then grown on the top surface of the structure, including the trench. Gate oxide layer 155 is grown in dry oxygen including a chloride such as TCA (tricholoroethane). The thickness of gate oxide layer ranges from 80–2000 Å.

As shown in FIG. 6E, a polysilicon gate 156 is deposited to fill and overflow the trench. This is preferably performed using a chemical vapor deposition process. Polysilicon gate 156 is then etched back to produce a planar surface. The die is masked to protect areas where the polysilicon gate 156 comes out of the trench to form a gate contact. Polysilicon gate 156 is doped with phosphorus to a sheet resistance of 20 Ω/sq. This doping may occur prior to or after the etchback. One method is to dope polysilicon gate 156 by "pre-depping" with POCl$_3$ before the trench is etched. Alternatively, the gate may be doped in situ while it is being formed.

As shown in FIG. 6F, P-body 157 is implanted through gate oxide 155 using a blanket implant of boron at a dose of $5\times10^{13}$ cm$^{-2}$ and an energy of 30–150 keV. P-body 157 is then driven in to 1.2 µm by heating 1–6 hours at 900°–1100° C. in a nitrogen atmosphere. Alternatively, a mask can be used to limit the P-body implant to the active areas of the device.

Figure 6I:
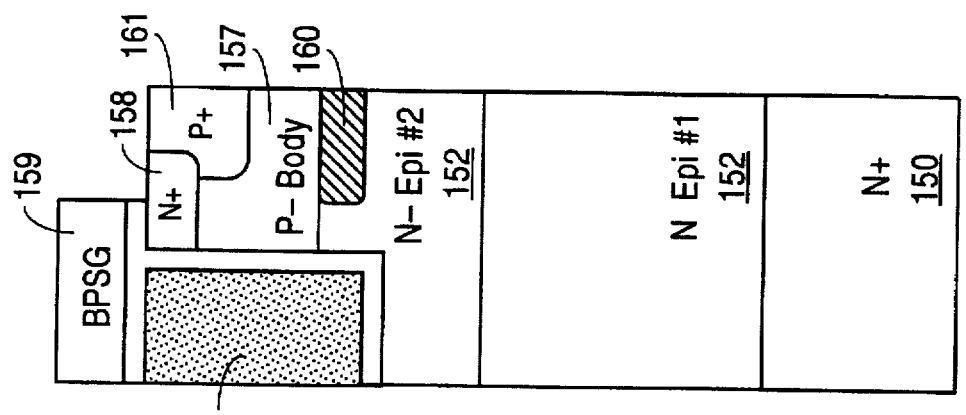
Figure 6H:
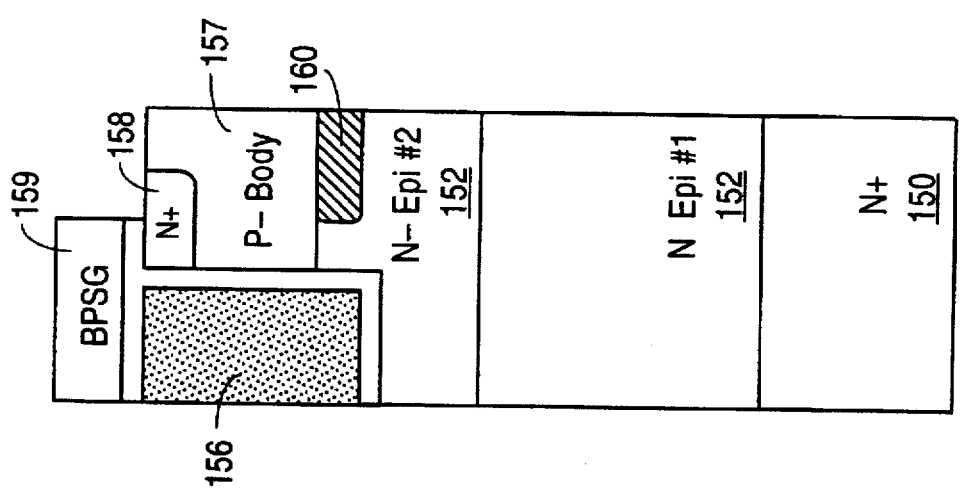
Figure 6G:
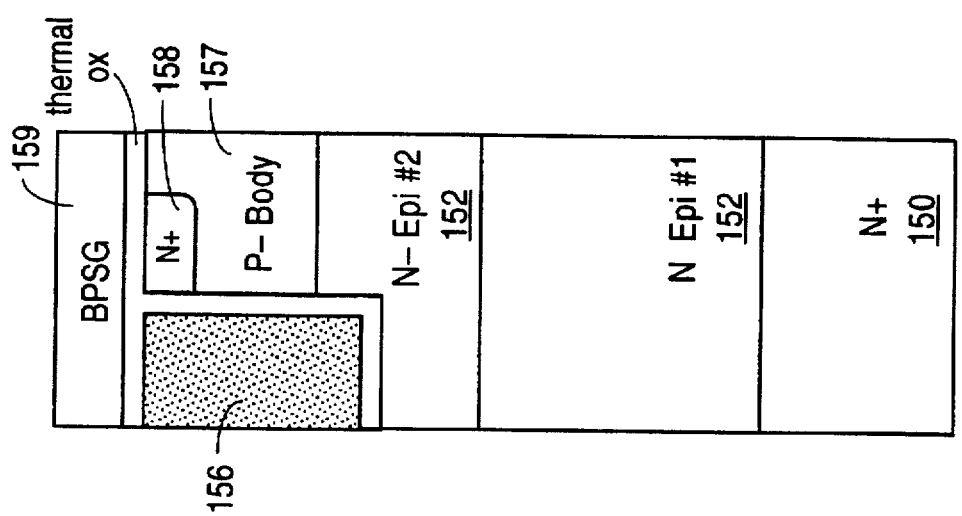

As shown in FIG. 6G, the top surface of oxide layer 155 is masked, and source region 158 is implanted at a dose of $4\times10^{15}$ to $1\times10^{16}$ cm$^{-2}$ at an energy of 40–80 keV. Source region 158 is driven in at 900°–1100° C. for 15–60 minutes. A BPSG layer 159 is then deposited on the top surface of the structure to a thickness of 3,000–10,000 Å.

As shown in FIG. 6H, BPSG layer 159 and the underlying oxide are then patterned and etched using photoresist to form a contact mask. N delta layer 160 is then implanted through the contact mask. N delta layer 160 is implanted with phosphorus at a dose of $1\times10^{12}$ to $5\times10^{13}$ cm$^{-2}$ and an energy of 60–250 keV.

As shown in FIG. 6I, P+ contact region 161 is implanted through the same mask, using boron at a dose of $8\times10^{14}$ to $5\times10^{15}$ cm$^{-2}$ and an energy of 20–80 keV. The structure is then subjected to a thermal treatment at 900°–1000° C. for 15–30 minutes. This process activates the N delta layer 160 and flows the BPSG layer 159.

Figure 6J:
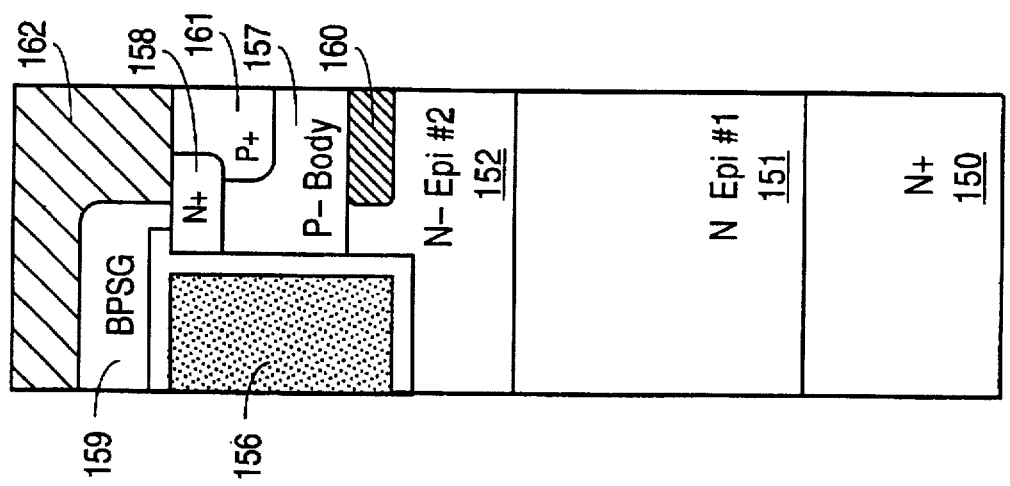

As shown in FIG. 6J, a metal layer 162 is deposited by sputtering to a thickness of 1–4 µm. Metal layer 162 is preferably aluminum with 2% copper and 2% silicon. Metal layer 162 is then appropriately etched, and the structure is covered with a passivation layer (not shown) of Si$_3$N$_4$ or BPSG.

In the above-described process, the contact mask is used as a mask for implanting N delta layer 160 and p+ contact region 161. Alternatively, N delta layer 160 and P+ contact region 161 could each be implanted through its own mask. Also, the sequence of the implants may be altered. For example, N delta layer 160 may be implanted immediately following the implanting of P-body 157 (FIG. 6F) and before the implanting of source region 158).

The delta layer may be implanted prior to the implanting and diffusion of the P-body region. If this is done, the delta layer diffuses during the body drive-in diffusion, increasing the depth of the lower boundary of the delta layer and the lateral spreading of the delta layer. If the delta layer is not to extend laterally to the trench, then its feature size at the time it is implanted must be reduced appropriately.

As previously described, the delta layer may be introduced prior to or after the formation of the P-body or prior to or after the formation of the source. Regardless of the sequence in which the delta layer, P-body and source are formed, the trench etching and gate formation may take place at any point in the sequence, including after all of the implantations have been completed. For example, the P-body, source, shallow P+ and delta layer could be formed prior to the etching of the trench, and then the trench, gate oxide and gate could be fabricated. Alternatively, the etching of the trench could follow the source diffusion but precede the delta layer implant. By changing the sequence of these process steps, the basic structure of the MOSFET remains the same but the risk of cumulative misalignments among various features may increase, thereby restricting the cell density.

Instead of forming the delta layer by implantation, the delta layer may be formed by increasing the concentration of dopant for a relatively short period of time while the epitaxial layer is being grown (e.g., by applying a short "pulse" of dopant.

Figure 6K:
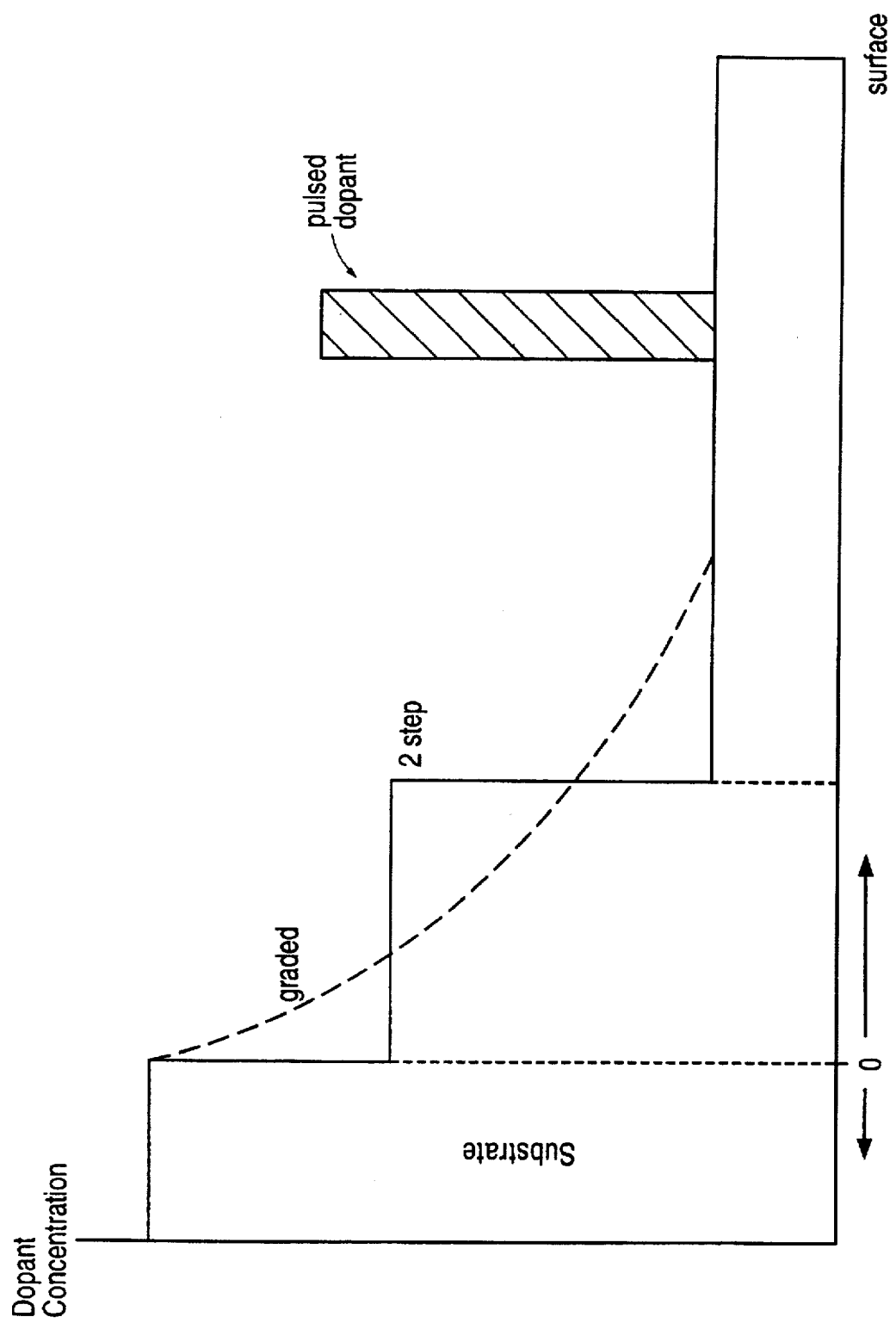
FIG. 6K illustrates profiles of the dopant concentration in the drift region in various embodiments of the invention.

FIG. 6K illustrates several of these possibilities, the horizontal axis representing the distance from the substrate/ epitaxial layer interface and the vertical axis representing dopant concentration during the growth of the epitaxial layer. The solid line represents the "step function" embodiment illustrated in FIG. 6A, and the dashed line represents the gradual reduction of dopant described above. The cross-hatched figure represents a delta layer that is formed by applying a "pulse" of dopant while the epitaxial layer is being grown.

Figure 8A:
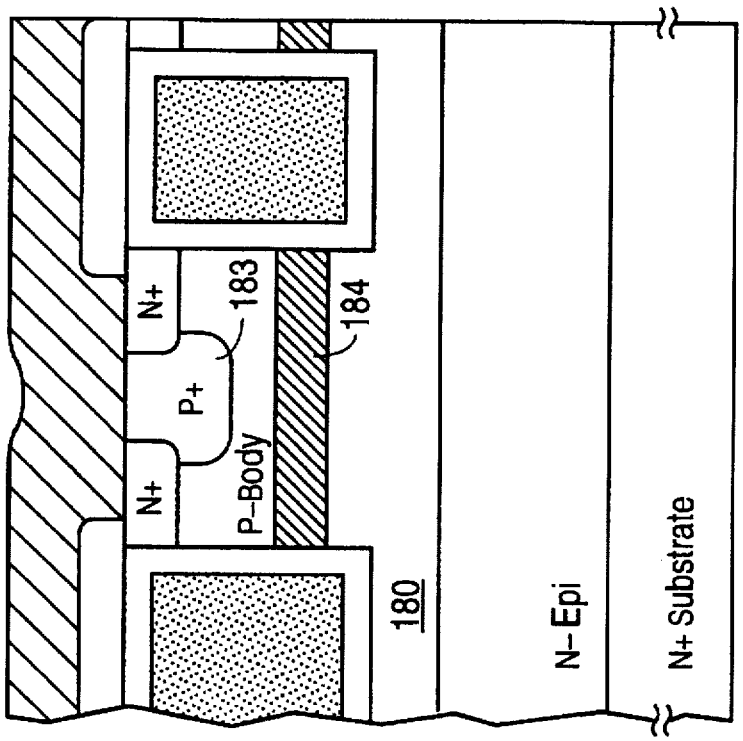
FIGS. 8A and 8B illustrate cross-sectional views of a MOSFET including a delta layer which extends to the side walls of the trench.
Figure 8B:
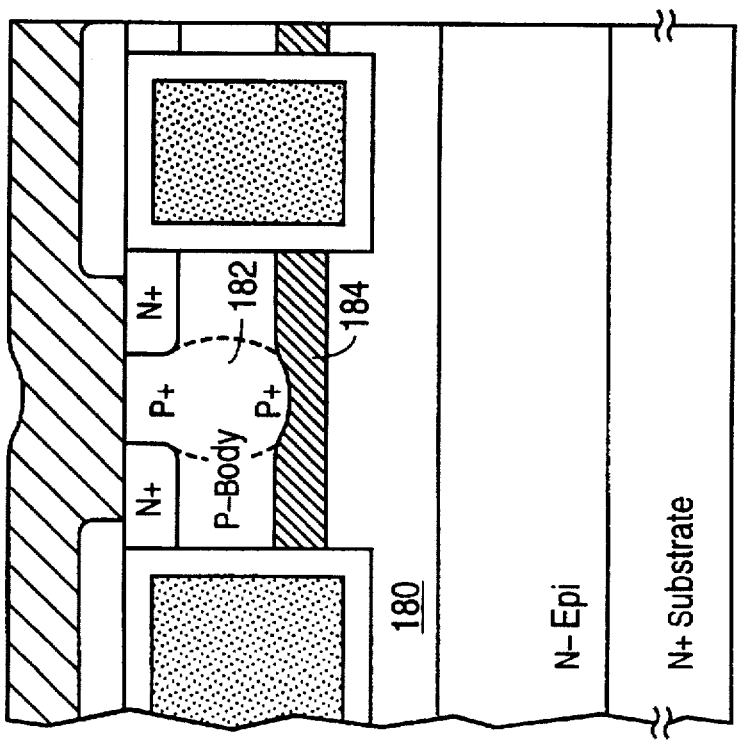

Whether the delta layer is formed by implantation or during the growth of the epitaxial layer, it may extend laterally across the surface of a wafer, except where it may be interrupted by the gate trenches. This is shown in FIGS. 8A and 8B, for example, where delta layer 184 extends into the adjoining MOSFET cells on a die.

Figure 7B:
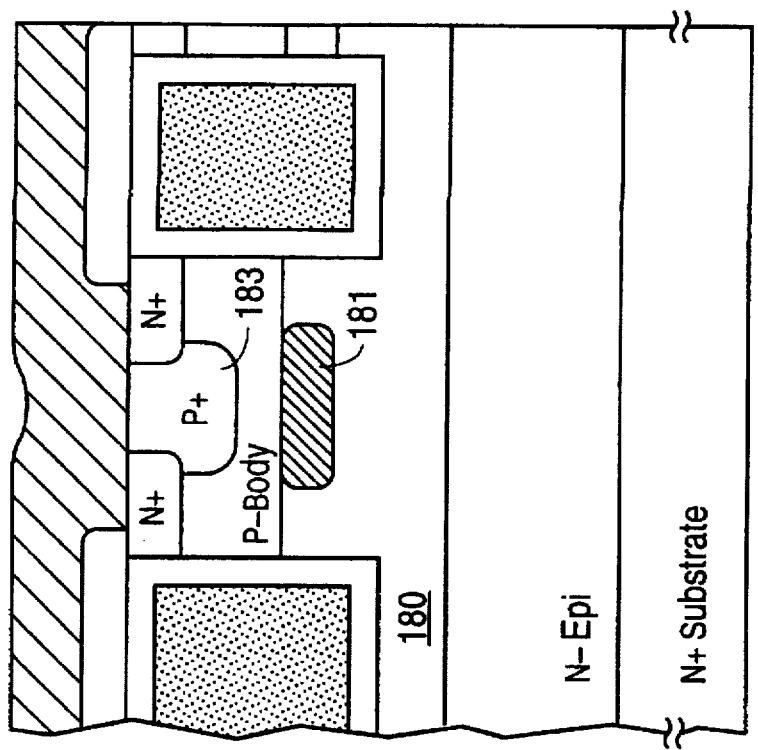
FIGS. 7A and 7B illustrate cross-sectional views of a MOSFET including an delta layer in conjunction with a central P+ region.
Figure 7A:
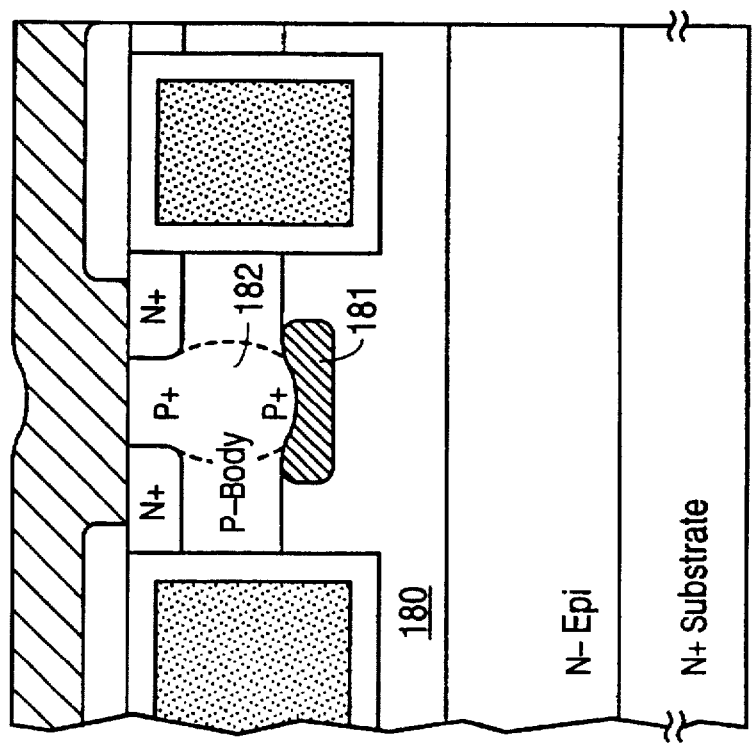

Alternatively, a central P+ region, such as is shown in FIG. 2C and FIGS. 3A–3C may be substituted for or may be included with delta layer 43LP. In another alternative embodiment, both delta layer 43LP and the central P+ region are omitted. FIG. 7A shows an embodiment which includes a region of high resistivity 180 in conjunction with a delta layer 181 and a relatively deep central P+ region 182. The embodiment of FIG. 7B is similar except that central P+ region 183 is shallower than P+ region of FIG. 7A. In FIGS. 8A and 8B, a delta layer 184 extends to the side wall of the trench. FIG. 8A includes deep central P+ region 182; FIG. 8B includes shallower P+ region 183.

To examine the performance of MOSFETs constructed in accordance with this invention, several simulated tests were performed using the two-dimensional device simulator Medici. The first device analyzed was a conventional 60 V device in the form of MOSFET 300 in FIG. 3A having a cell width of 9 μm (i.e., the distance from the center of the gate to the center of the cell was 4.5 μm). With a gate-to-source voltage $V_{GS}=10$ V and with a drain-to-source voltage $V_{DS}=0.1$ V, the drain current per unit of channel width $I_{DS}$ was $2.0 \times 10^{-6}$ A/μm. For a similar 7 μm cell MOSFET having the same $V_{GS}$ and $V_{DS}$, the drain current per unit width $I_{DS}/W$ was $2.1 \times 10^{-6}$ A/μm. ($I_{DS}/W$ is the current per unit width measured parallel to the surface of the gate. Thus, for a square cell having a cell width $Y_{cell}$ and a gate width G, the total current that flows through the cell is equal to 4 $I_{DS}/W$ ($Y_{cell}-G$).) Because of the increased packing density in the 7 μm device, the total current flowing through the 7 μm device was greater and represented approximately an 18% improvement in the specific on-resistance (i.e., the resistance per unit area of the device).

Figure 1:
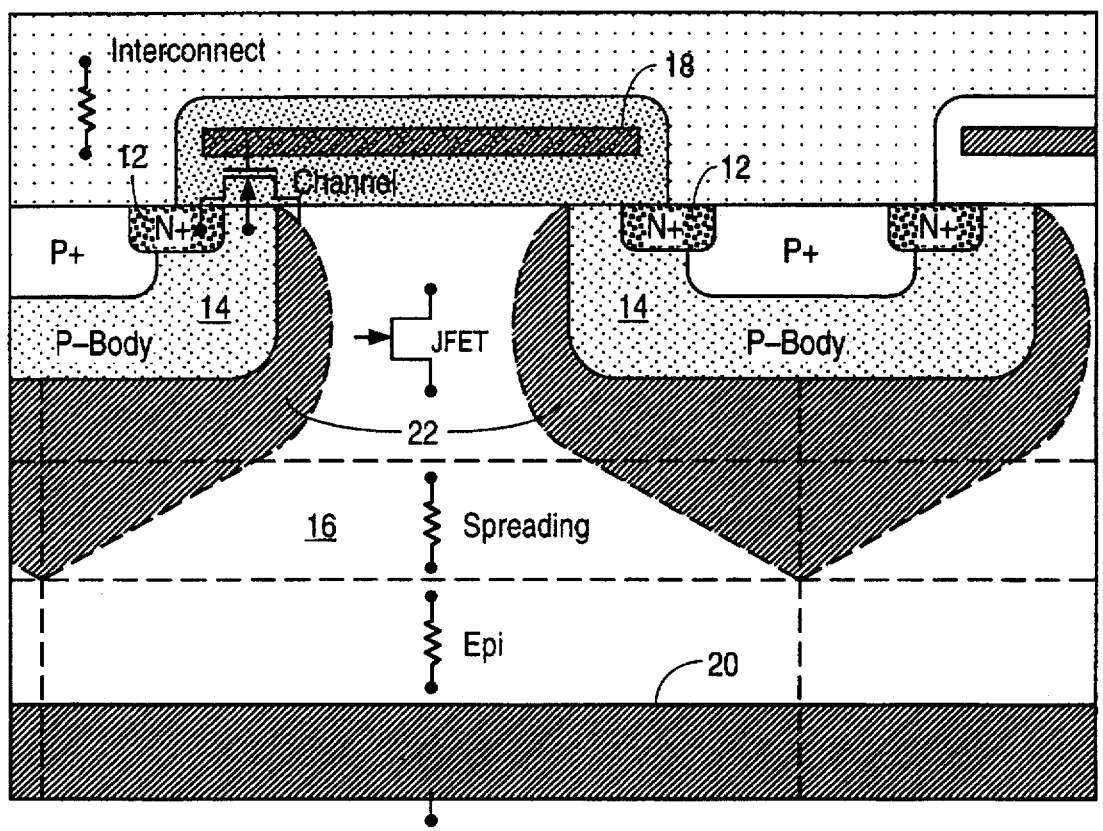
FIG. 1 illustrates a cross-sectional view of a conventional planar double-diffused MOSFET.
Figure 2A:
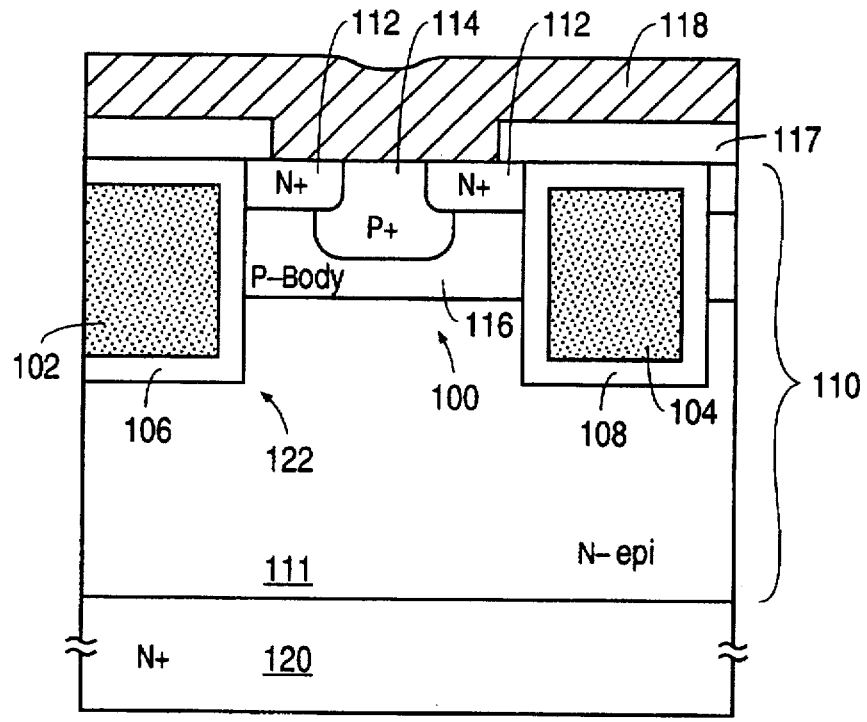
FIGS. 2A and 2B illustrate cross-sectional and plan views, respectively, of a cell of a typical vertical trench N-channel MOSFET having a relatively shallow central P+ contact region.
Figure 2B:
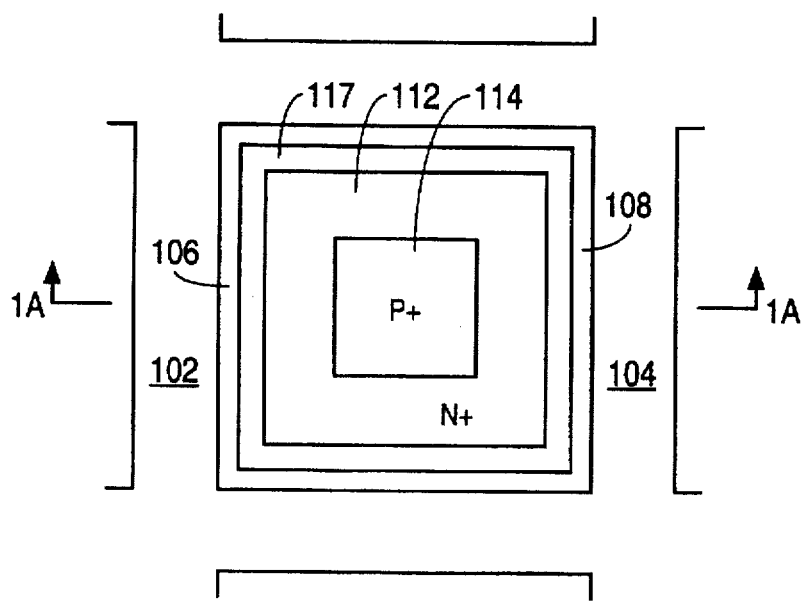
Figure 2C:
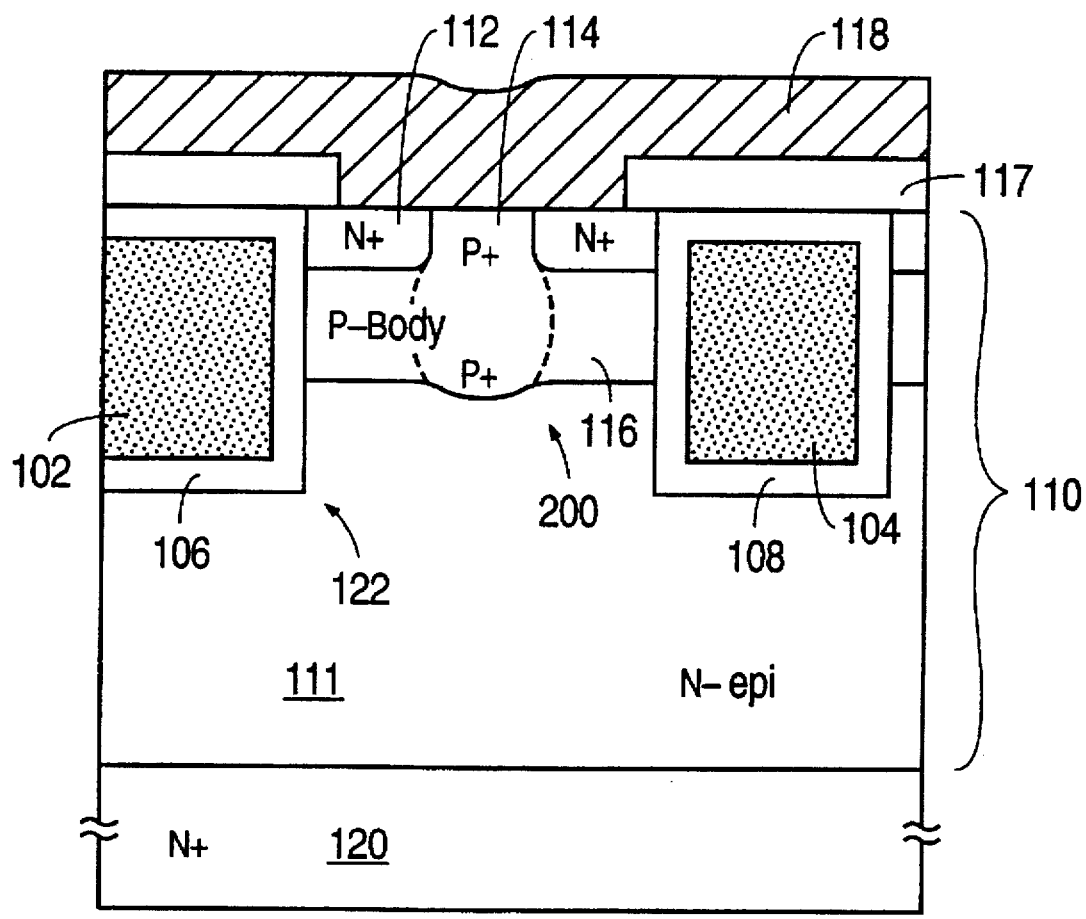
FIG. 2C illustrates a cross-sectional view of a similar N-channel MOSFET in which the central P+ contact region has been extended below the bottom edge of the P body region.
Figure 3A:
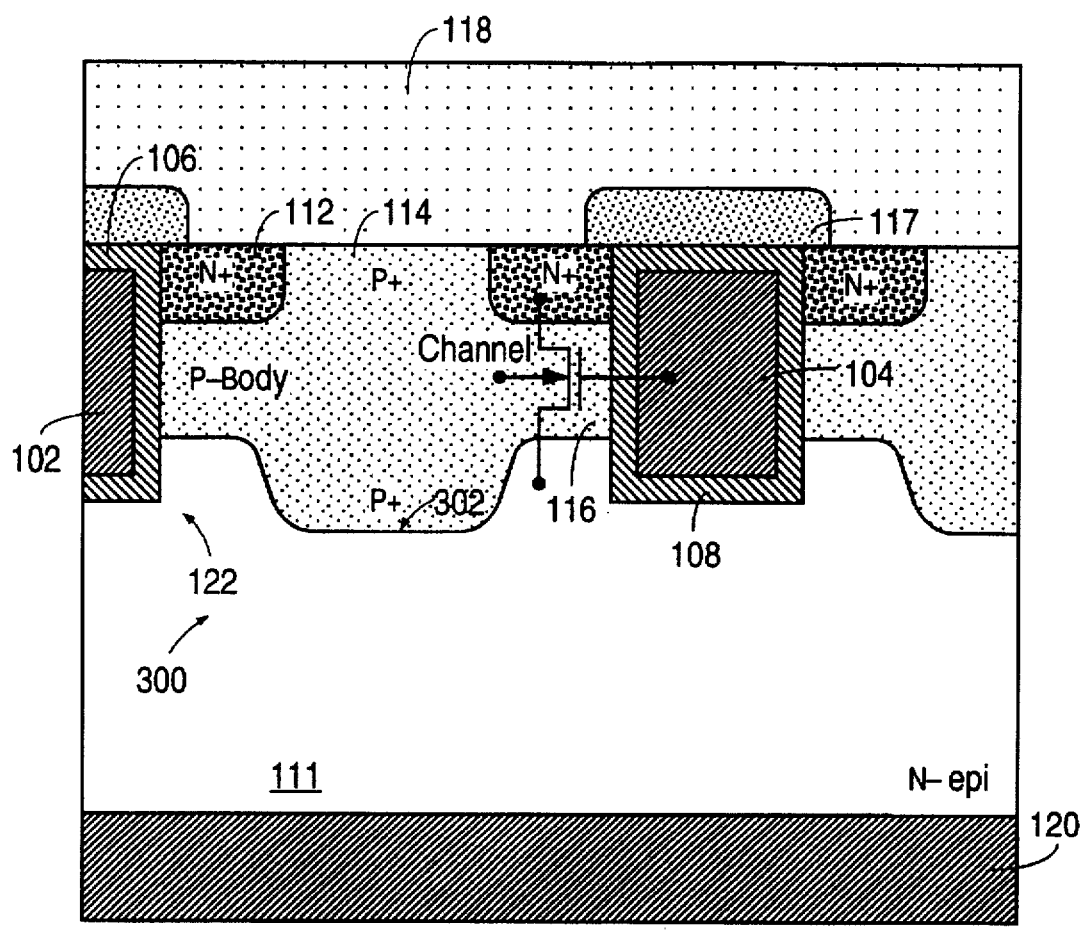
FIG. 3A illustrates a cross-sectional view of a similar N-channel MOSFET in which the central P+ contact region has been extended to a location below the bottom of the trench.
Figure 3B:
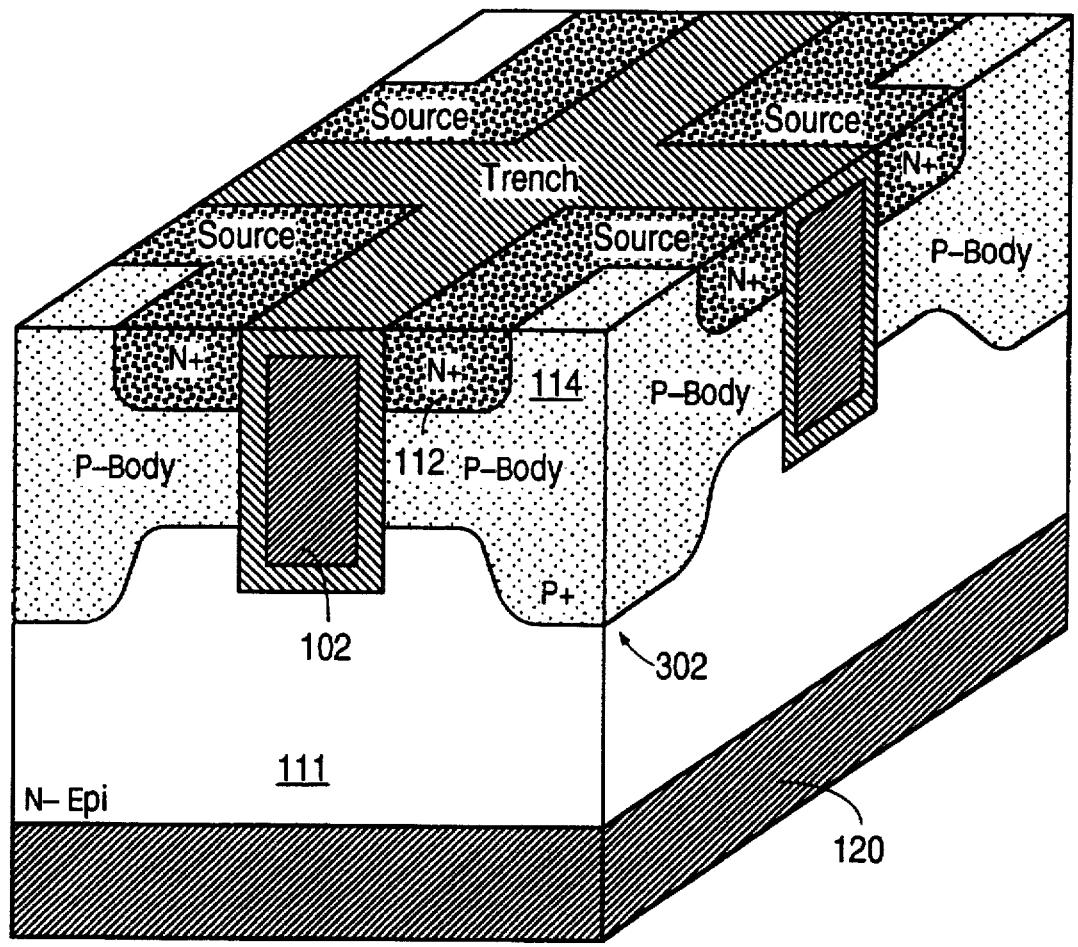
FIG. 3B illustrates a perspective cross-sectional view of the N-channel MOSFET shown in FIG. 3A.
Figure 3C:
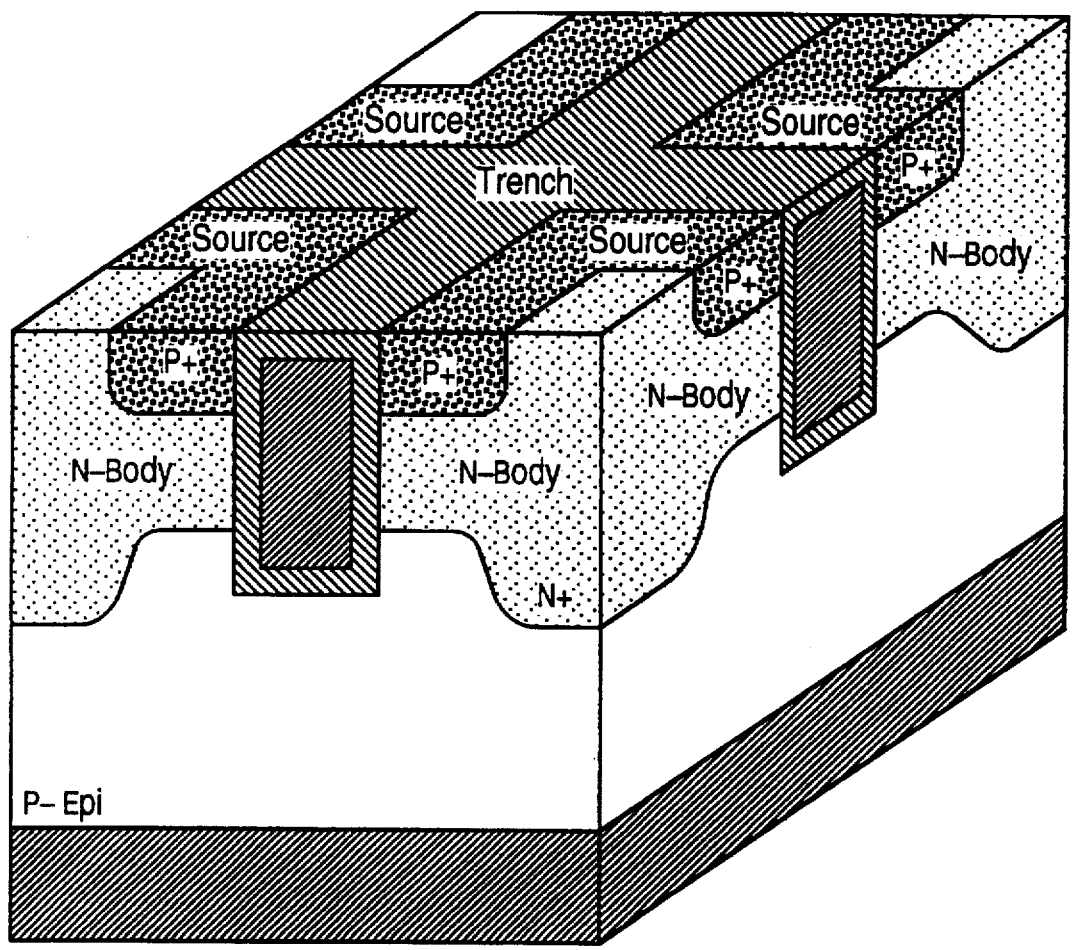
FIG. 3C illustrates a perspective cross-sectional view of a similar P-channel MOSFET.
Figure 3D:
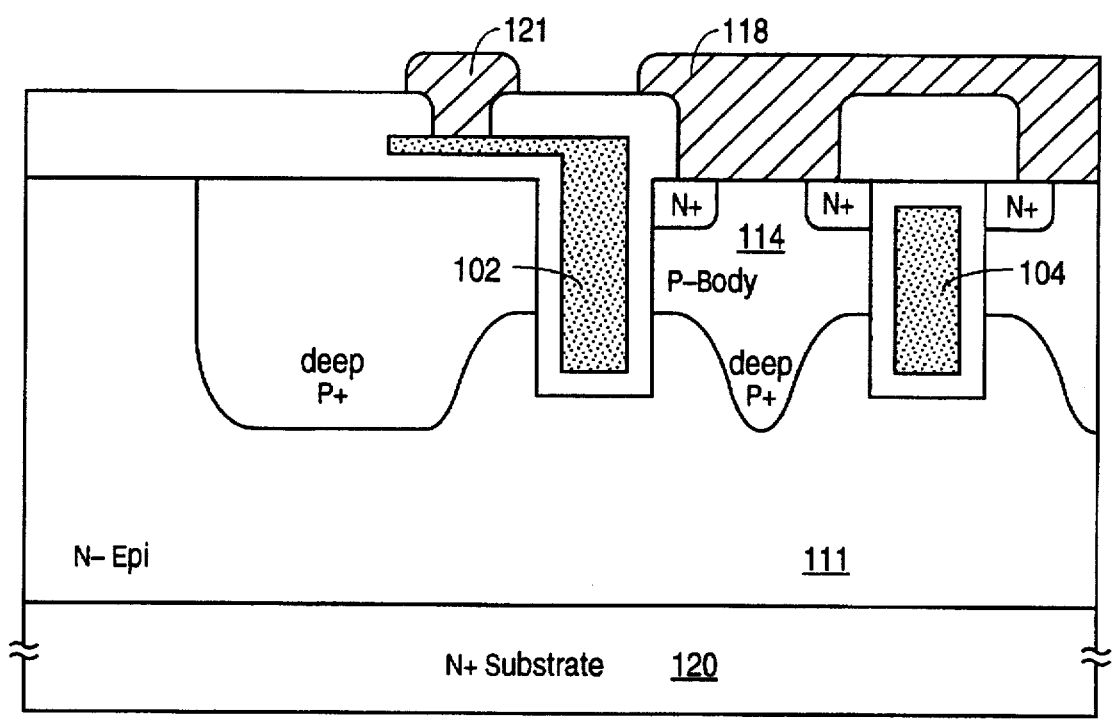
FIG. 3D illustrates a cross-sectional view showing a gate metal contact formed on the top surface of the device.

Both the 7 μm and 9 μm cell width devices tested had a deep central P+ region (see FIG. 3A). This structure is impossible in a 5 μm cell device because the P+ region would touch the edge of the trench. As noted above, this leads to an unacceptably high threshold voltage and a severely "pinched" drift region of very high on-resistance.

For this reason, a 5 μm cell device of the structure illustrated in FIG. 4 was tested. With $V_{GS}=10$ V and $V_{DS}=0.1$ V, the drain current $I_{DS}/W$ was equal to $1.8 \times 10^{-6}$ A/μm. Again, because of the increased packing density in a 5 μm cell device, this current corresponds to a 20% reduction in on-resistance per unit area as compared with the 7 μm cell device and a 40% reduction in on-resistance as compared with the 9 μm cell device.

Figure 9A:
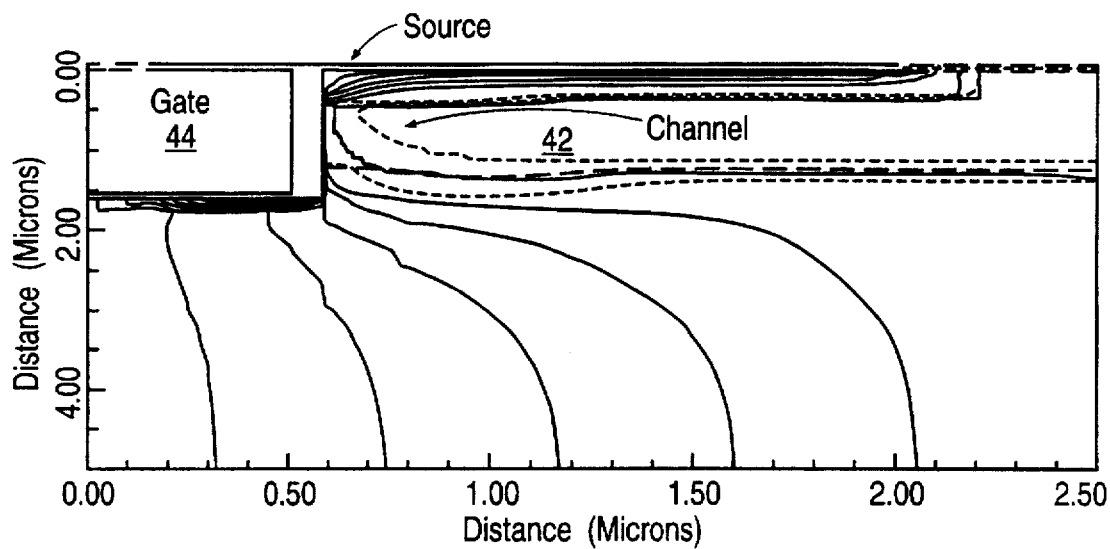
FIG. 9A illustrates the distribution of current in a 5 µm cell MOSFET in accordance with this invention.
Figure 9B:
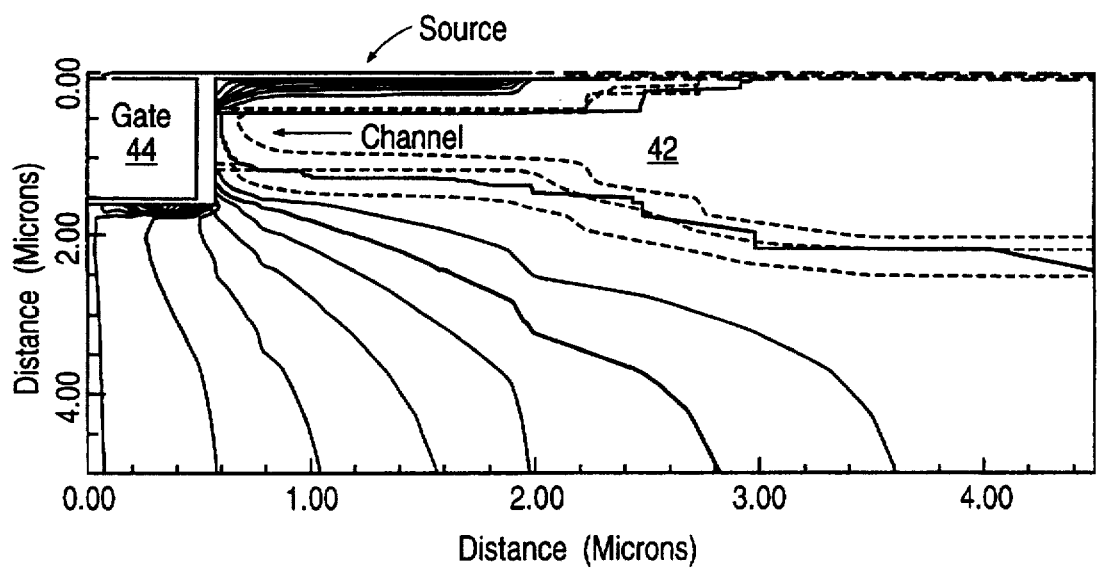
FIG. 9B illustrates the current distribution in a conventional 9 µm cell MOSFET.

FIG. 9A illustrates the distribution of current in the 5 μm cell device in accordance with this invention. The location of P-body region 42 and gate 44 are shown in FIG. 9A. FIG. 9B illustrates the current distribution in the 9 μm cell device analyzed. The spaces between the flow lines in FIGS. 9A and 9B represent similar percentages of the total current. A comparison of FIGS. 9A and 9B indicates that the MOSFET fabricated in accordance with the invention had a more uniform current distribution. This tends to reduce the on-resistance of the device.

Figure 10A:
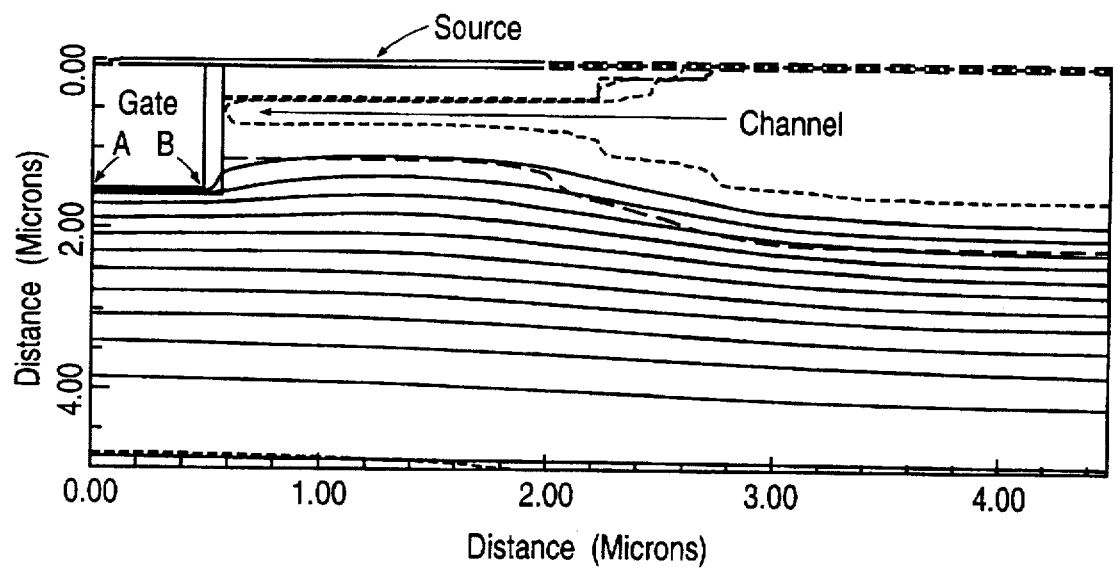
FIG. 10A illustrates the equipotential lines in the 9 µm cell MOSFET.
Figure 10B:
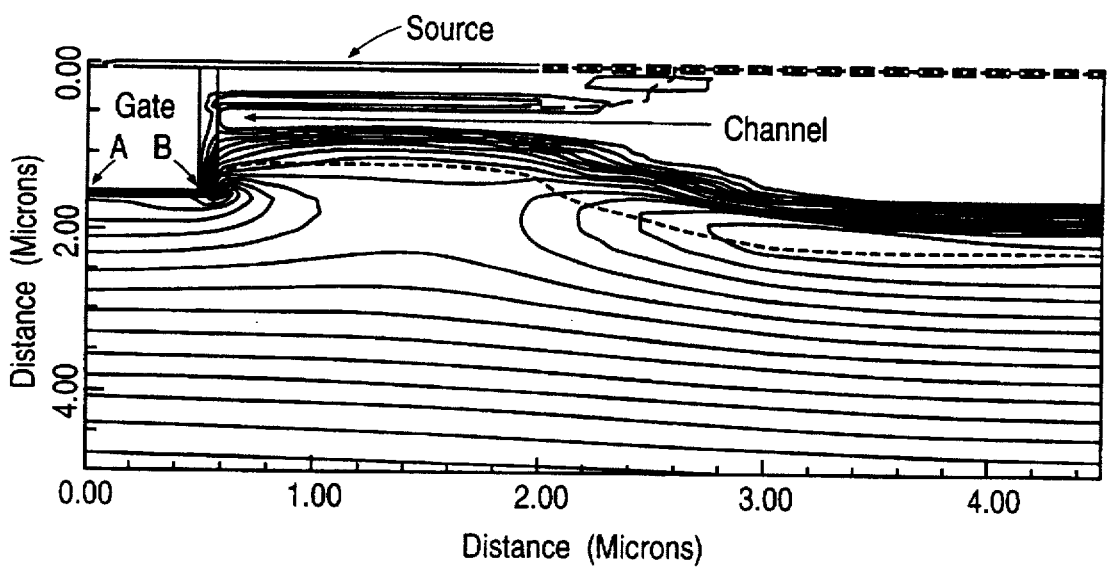
FIG. 10B illustrates the electric field contours in the 9 µm cell MOSFET.

The breakdown voltage of the 5 μm cell device was analyzed to see how it compared with the breakdown voltage of the 9 μm cell device. Again, the two-dimensional device simulator Medici was used. FIGS. 10A and 10B show the equipotential lines and the electric field contours, respectively, of the 9 μm cell device in the off state with $V_{DS}=60$ V. Referring to FIG. 10B, the electric field at the bottom center of the trench (point A) and the corner of the trench (point B) were 26 V/μm and 36.2 V/μm, respectively.

Figure 11A:
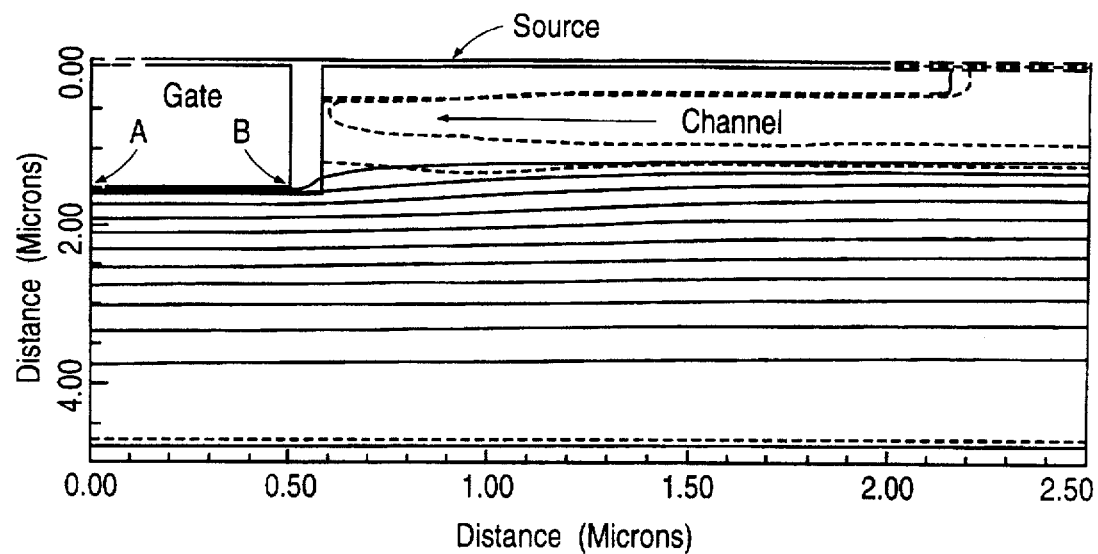
FIG. 11A illustrates the equipotential lines in the 5 µm cell MOSFET in accordance with this invention.
Figure 11B:
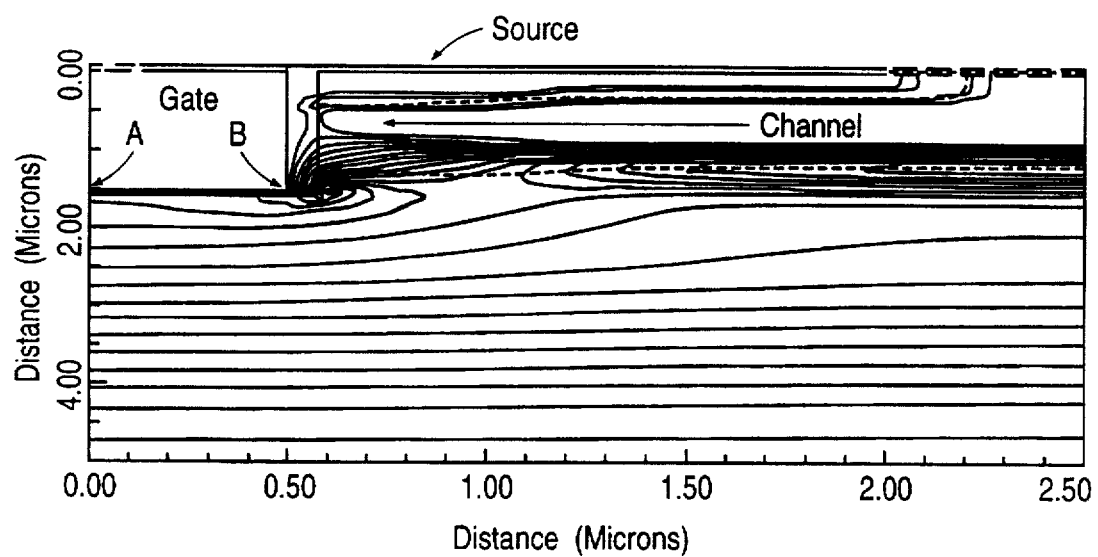
FIG. 11B illustrates the electric field contours in the 5 µm cell MOSFET in accordance with this invention.

The equipotential lines and electric field contours for the 5 μm cell device are shown in FIGS. 11A and 11B, respectively. It is particularly important to note that the electric field at points A and B were 29.1 V/μm and 35.8 V/μm, respectively. A comparison with the corresponding values for the 9 μm cell device suggests that the breakdown potential of the 5 μm cell device is about the same.

Figure 12A:
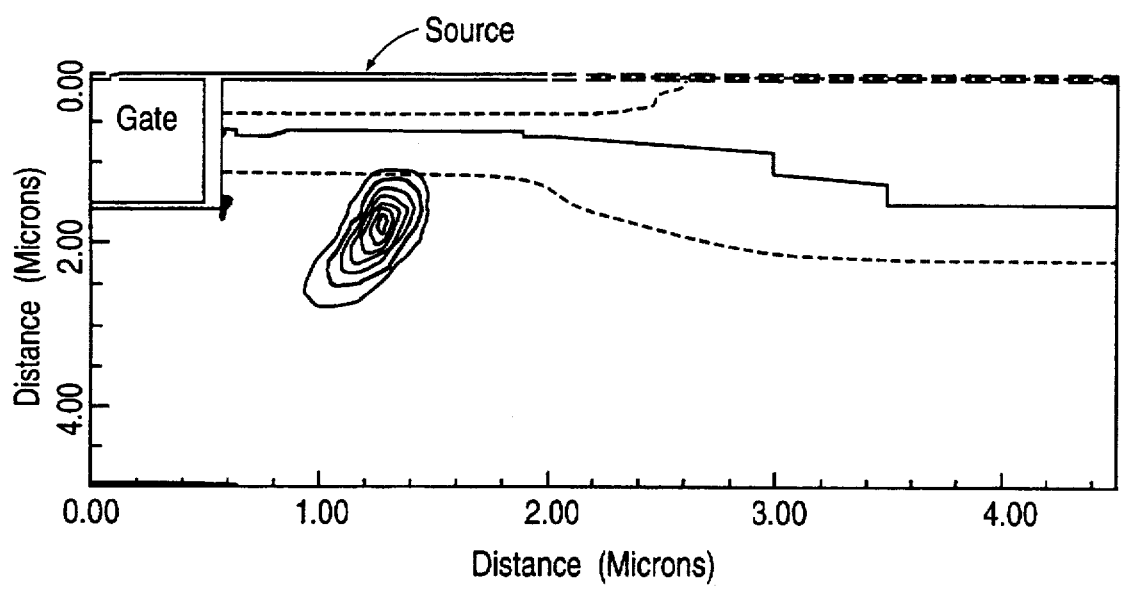
FIG. 12A illustrates the ionization rates in the conventional 9 µm cell MOSFET.
Figure 12B:
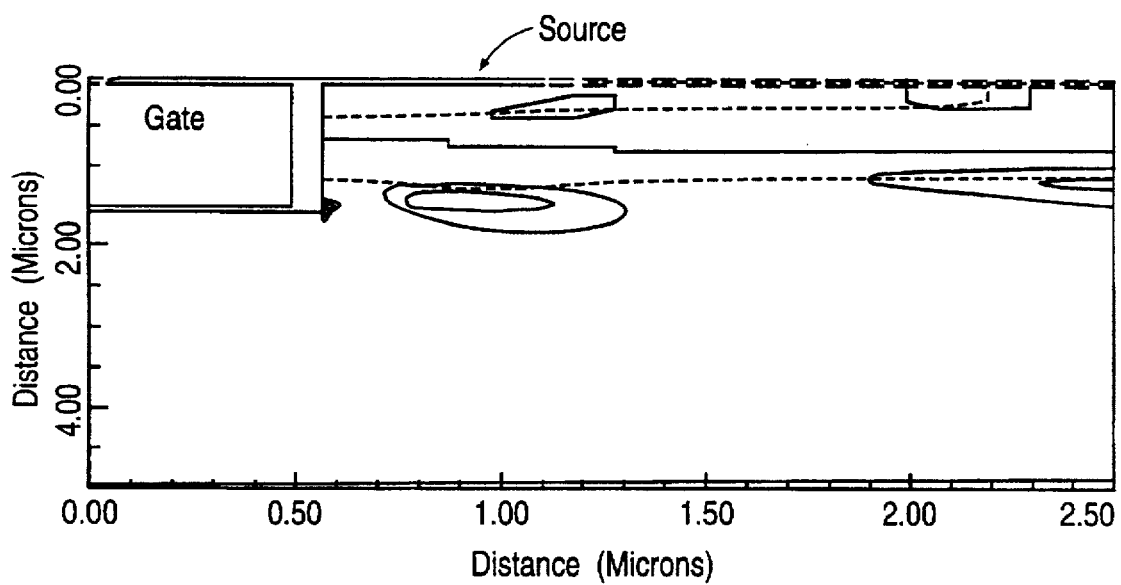
FIG. 12B illustrates the ionization rates in the 5 µm cell MOSFET in accordance with this invention.

FIGS. 12A and 12B show the ionization rates for the 9 μm cell and 5 μm cell devices, respectively. The ionization rate shown for the 9 μm cell device in FIG. 12A yields an ionization integral of 0.78 at the junction between the deep central P+ region and the drift region. The data shown in FIG. 12B yield an ionization integral of 0.73 at the junction between the P-body and the drift region in the 5 μm cell device. Again, these data imply similar breakdown voltages for the two MOSFETs.

Accordingly, the data shown in FIGS. 10A, 10B, 11A, 11B, 12A and 12B show that a 5 µm cell device fabricated in accordance with this invention has breakdown characteristics comparable to those of a conventional 9 µm cell device, and thus the improved on-resistance described above is not achieved at the cost of a reduced breakdown voltage.

Figure 13:
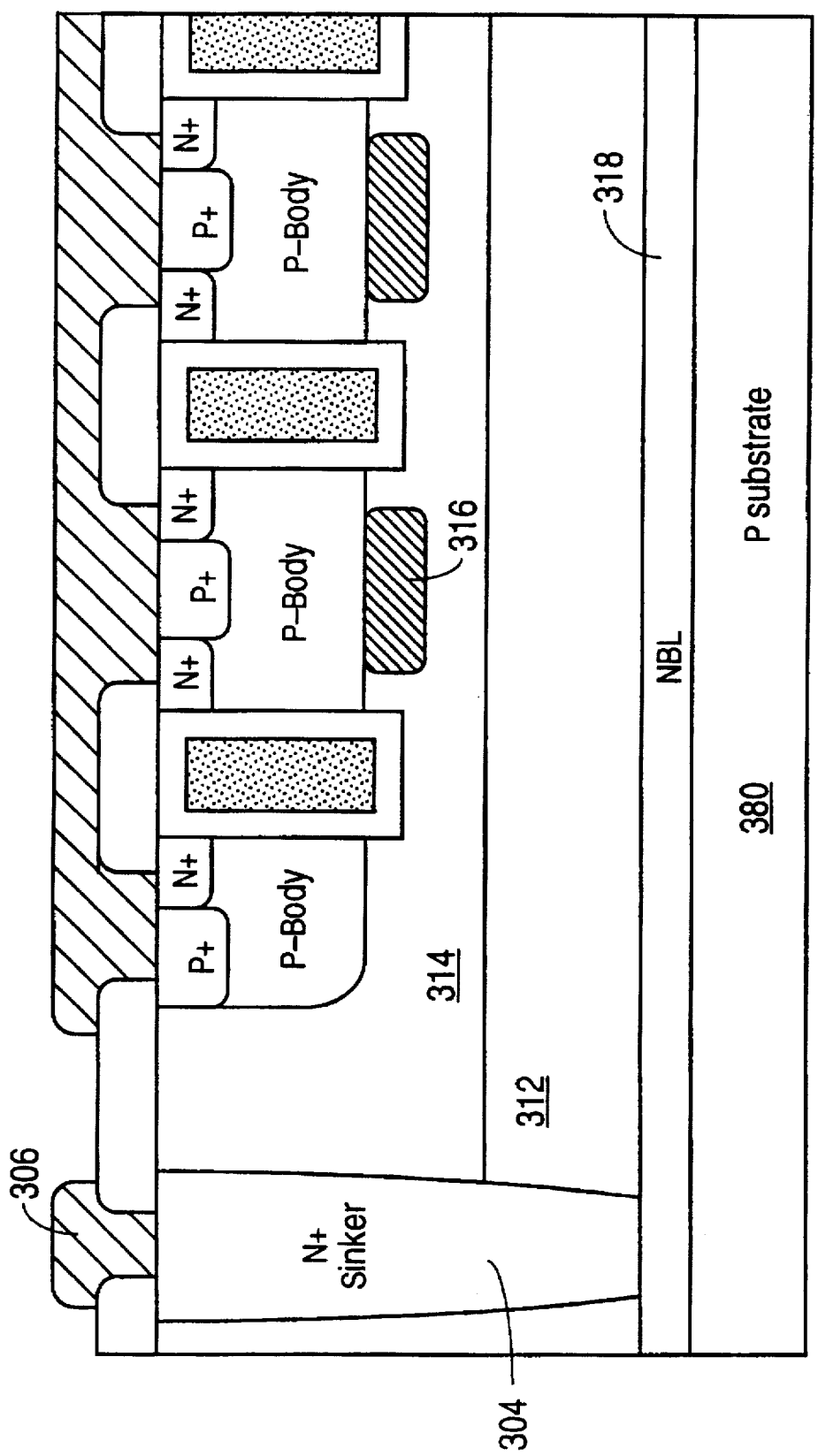
FIG. 13 illustrates a cross-sectional view of an embodiment in the form of a quasi-vertical MOSFET.

The embodiments described above are vertical trench MOSFETs, in which the substrate forms the drain and the drain contact is typically located at the bottom surface of the die. The principles of this invention are also applicable to so-called "quasi-vertical" MOSFETs wherein the drain contact is made at the top surface of the die. FIG. 13 illustrates a quasi-vertical MOSFET, similar to the MOSFET shown in FIG. 7B, which includes a drift region 312, a region of high resistivity 314 and a delta layer 316. The drain, however, is formed by an buried layer 318, which is located at the interface of P substrate 320 and drift region 312. A drain contact 306 at the top surface of the die is tied to buried layer 318 by means of an sinker 304.

While the embodiments described above are N-channel MOSFETs, it will be apparent that the principles of the invention are also applicable to the P-channel MOSFETs.

The specific embodiments described above are only illustrative of the broad principles of this invention and are not to be considered as limiting. The scope of this invention is defined only in the following claims.

We claim:

1. A method of fabricating a MOSFET in a semiconductor material, said method comprising the steps of:
   providing a substrate;
   growing an epitaxial layer;
   introducing a dopant of a first conductivity type into said epitaxial layer while said epitaxial layer is being grown;
   reducing the concentration of said dopant of said first conductivity type being introduced into said epitaxial layer while said epitaxial layer is being grown so as to form a region of high resistivity, said region of high resistivity having a resistivity which is higher than a resistivity of other portions of said epitaxial layer;
   etching a trench in said semiconductor material;
   forming an insulated gate in said trench;
   introducing a dopant of a second conductivity type into said semiconductor material so as to form a body region; and
   introducing a dopant of said first conductivity type into said semiconductor material so as to form a source region.

2. The method of claim 1 wherein said step of reducing the concentration of said dopant of said first conductivity type includes reducing the concentration of said dopant of said first conductivity type abruptly from a first concentration to a second concentration.

3. The method of claim 1 wherein said step of reducing the concentration of said dopant of said first conductivity type includes reducing the concentration of said dopant of said first conductivity type gradually and monotonically.

4. The method of claim 1 wherein said step of etching said trench precedes said step of introducing said dopant of said second conductivity type to form said body region.

5. The method of claim 1 wherein said step of etching said trench follows said step of introducing said dopant of said second conductivity type to form said body region.

6. The method of claim 1 wherein said step of etching said trench includes etching said trench so as to form a MOSFET cell.

7. The method of claim 6 wherein said MOSFET cell is formed between parallel trench stripes.

8. The method of claim 6 wherein said MOSFET cell is formed in a polygonal shape.

9. The method of claim 6 further comprising the step of introducing said dopant of said second conductivity type near a center of said MOSFET cell so as to form a central diffusion.

10. The method of claim 9 wherein said central diffusion extends to a level below a bottom of said trench.

11. The method of claim 1 further comprising the step of introducing a dopant of said first conductivity type so as to form a delta layer disposed laterally from said trench, said delta layer having a concentration of said dopant of said first conductivity type greater than a concentration of said dopant of said first conductivity type in said region of high resistivity.

12. The method of claim 11 wherein said delta layer is formed by introducing said dopant of said first conductivity type during the step of growing said epitaxial layer.

13. The method of claim 11 wherein said delta layer is formed by implanting said dopant of said first conductivity type into said semiconductor material.

14. The method of claim 13 wherein said delta layer extends laterally to a side wall of said trench.

15. The method of claim 13 further comprising the step of forming a mask before the introduction of said dopant of said first conductivity type to form said delta layer such that said delta layer does not extend to a side wall of said trench.

16. The method of claim 15 wherein said mask is also used to open a contact region at a surface of said semiconductor material.

17. The method of claim 15 wherein said step of reducing the concentration of said dopant of said first conductivity type includes reducing the concentration of said dopant of said first conductivity type abruptly from a first concentration to a second concentration.

18. The method of claim 15 wherein said step of etching said trench includes etching said trench so as to form a MOSFET cell.

19. The method of claim 18 further comprising the step of introducing said dopant of said second conductivity type near a center of said MOSFET cell so as to form a central diffusion.

20. The method of claim 19 wherein said central diffusion is formed through said mask.

21. The method of claim 20 wherein said mask is also used to open a contact region at a surface of said semiconductor material.

* * * * *

UNITED STATES PATENT AND TRADEMARK OFFICE
CERTIFICATE OF CORRECTION

PATENT NO. : 5,674,766
DATED : October 7, 1997
INVENTOR(S) : Darwish, Mohamed N.; Williams, Richard K.

It is certified that error appears in the above-identified patent and that said Letters Patent is hereby corrected as shown below:

Column 9, lines 51 and 62, delete "88" and insert --8B--.

Signed and Sealed this

Sixteenth Day of June, 1998

Attest:

BRUCE LEHMAN

Attesting Officer

Commissioner of Patents and Trademarks